(12) United States Patent
Kuddannavar et al.

(10) Patent No.: US 10,734,084 B2
(45) Date of Patent: Aug. 4, 2020

(54) SCHEME TO REDUCE READ DISTURB FOR HIGH READ INTENSIVE BLOCKS IN NON-VOLATILE MEMORY

(71) Applicant: Western Digital Technologies, Inc., San Jose, CA (US)

(72) Inventors: Narayan Kuddannavar, Bangalore (IN); Swaroop Kaza, Milpitas, CA (US); Sainath Viswasarai, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/428,305

(22) Filed: May 31, 2019

(65) Prior Publication Data

US 2019/0371416 A1   Dec. 5, 2019

(30) Foreign Application Priority Data

May 31, 2018   (IN) .............................. 201841020420

(51) Int. Cl.
G11C 11/34       (2006.01)
G11C 16/04       (2006.01)
G11C 16/34       (2006.01)
G11C 16/10       (2006.01)
G11C 16/26       (2006.01)
H01L 27/11582    (2017.01)
H01L 27/11565    (2017.01)
H01L 27/1157     (2017.01)

(52) U.S. Cl.
CPC ...... *G11C 16/3427* (2013.01); *G11C 16/0483* (2013.01); *G11C 16/10* (2013.01); *G11C 16/26* (2013.01); *G11C 16/3459* (2013.01); *H01L 27/1157* (2013.01); *H01L 27/11565* (2013.01); *H01L 27/11582* (2013.01)

(58) Field of Classification Search
CPC . G11C 16/3427; G11C 16/0483; G11C 16/10; G11C 16/26
See application file for complete search history.

(56) References Cited

U.S. PATENT DOCUMENTS

| | | | |
|---|---|---|---|
| 7,257,032 B2 | 8/2007 | Fujiu et al. | |
| 8,315,093 B2 | 11/2012 | Dong et al. | |
| 8,743,615 B2 | 6/2014 | Lee et al. | |
| 9,025,375 B2 | 5/2015 | Chang et al. | |
| 9,460,799 B1 | 10/2016 | Costa et al. | |
| 2012/0297116 A1 | 11/2012 | Gurgi | |
| 2013/0128666 A1* | 5/2013 | Avila | G11C 16/3418 365/185.11 |
| 2015/0170754 A1 | 6/2015 | Ma | |
| 2016/0225461 A1* | 8/2016 | Tuers | G11C 11/5642 |
| 2018/0350446 A1* | 12/2018 | K | G11C 29/38 |

* cited by examiner

*Primary Examiner* — Toan K Le
(74) *Attorney, Agent, or Firm* — Vierra Magen Marcus LLP

(57) ABSTRACT

A non-volatile storage system comprises non-volatile memory cells arranged in physical blocks, and one or more control circuits in communication with the non-volatile memory cells. The one or more control circuits are configured to write data to a physical block of the non-volatile memory cells with a scheme to reduce read disturb if a logical block associated with the physical block has a read intensity greater than a threshold.

18 Claims, 26 Drawing Sheets

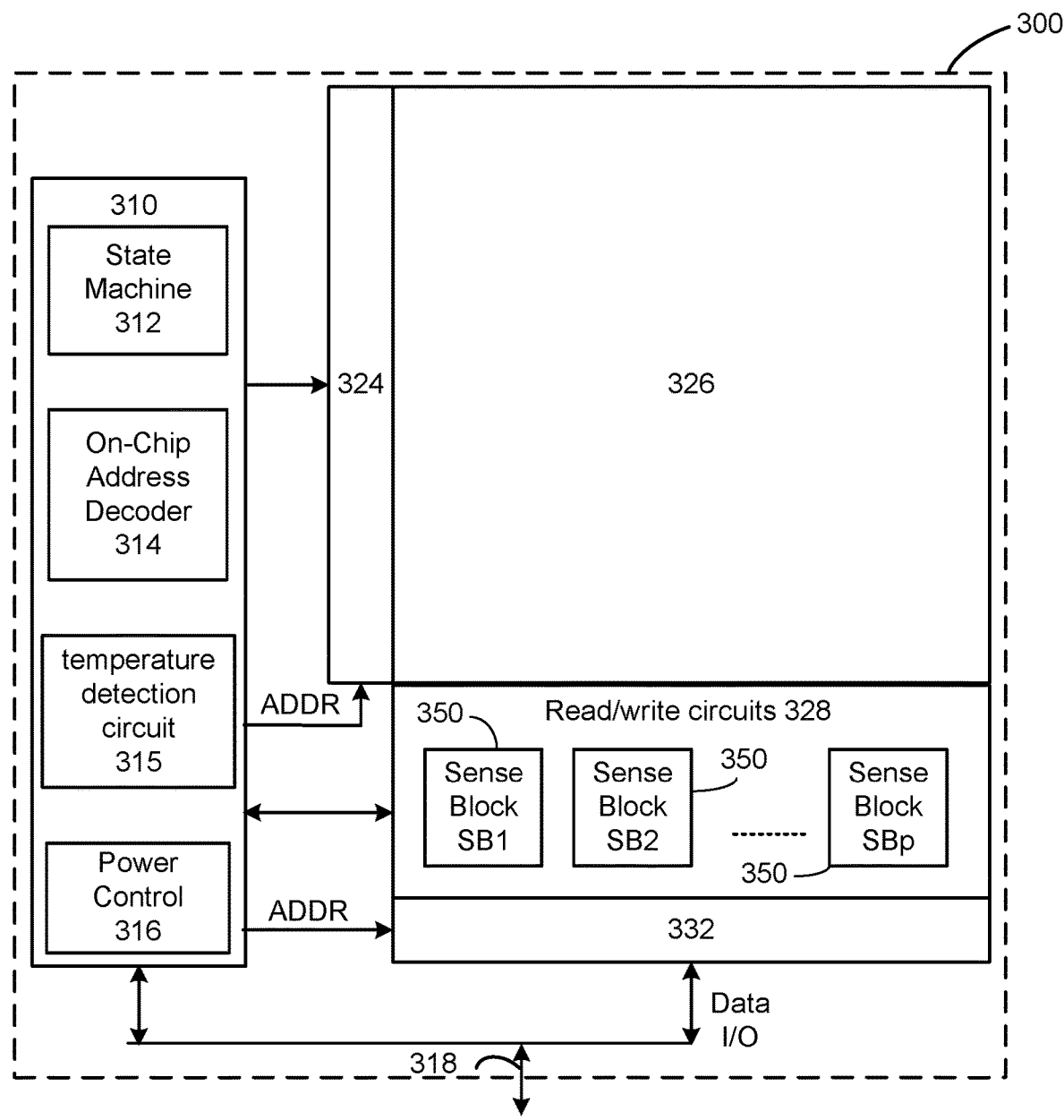

Figure 4D
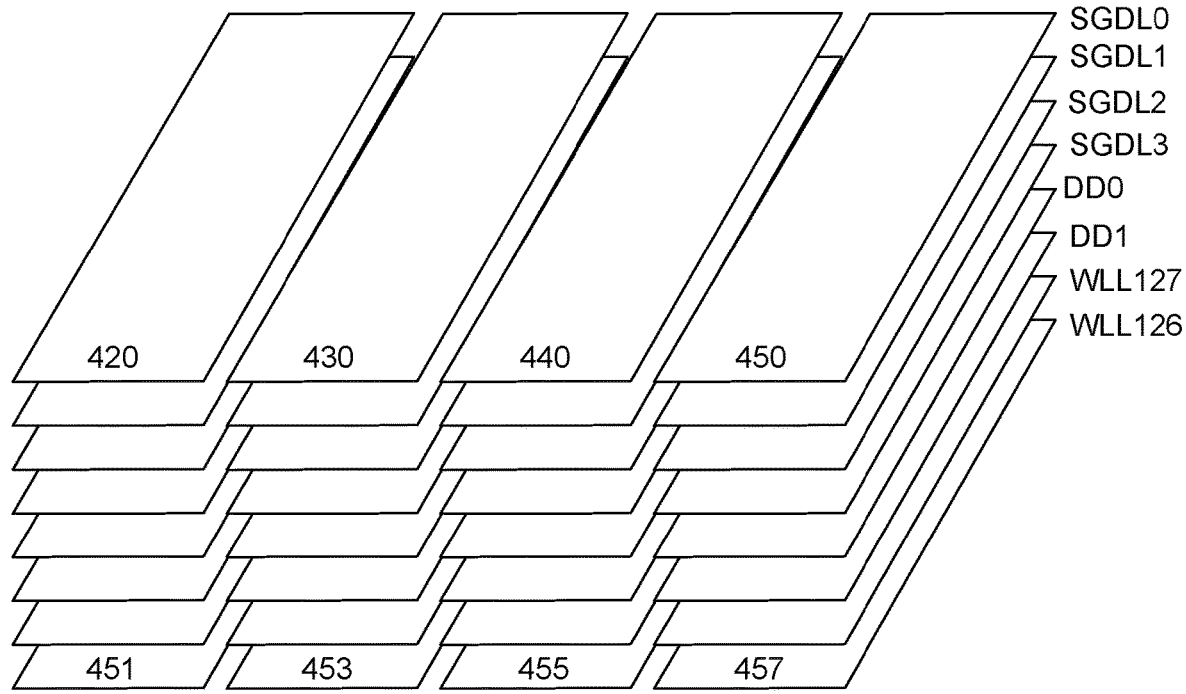
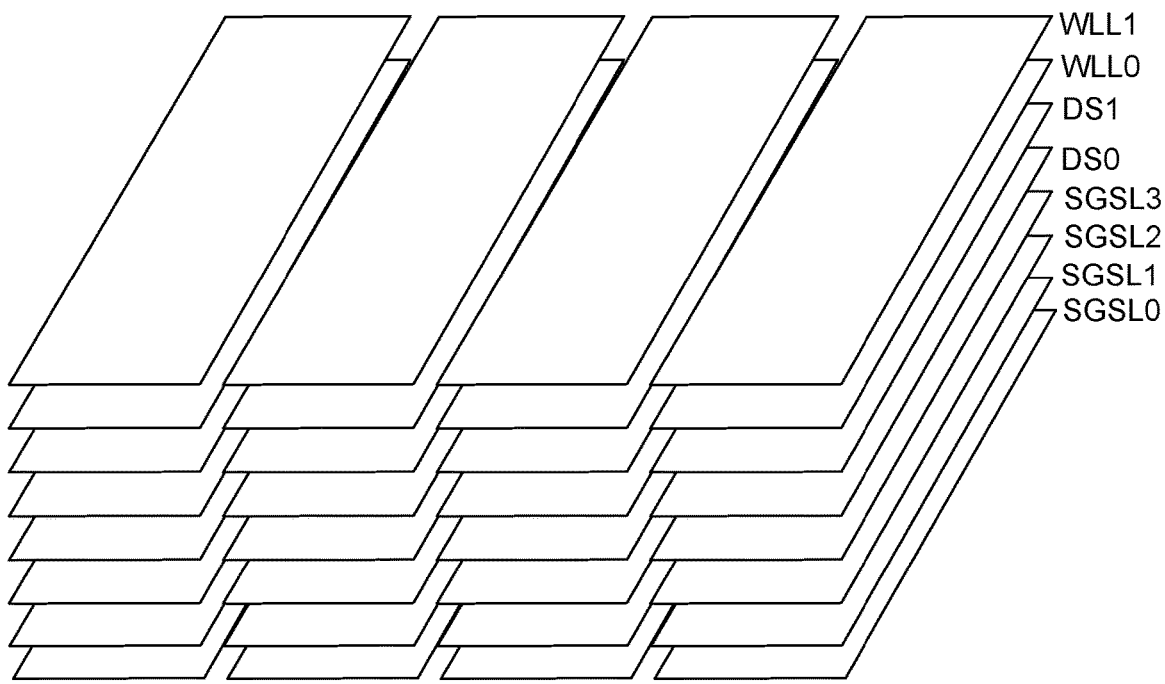

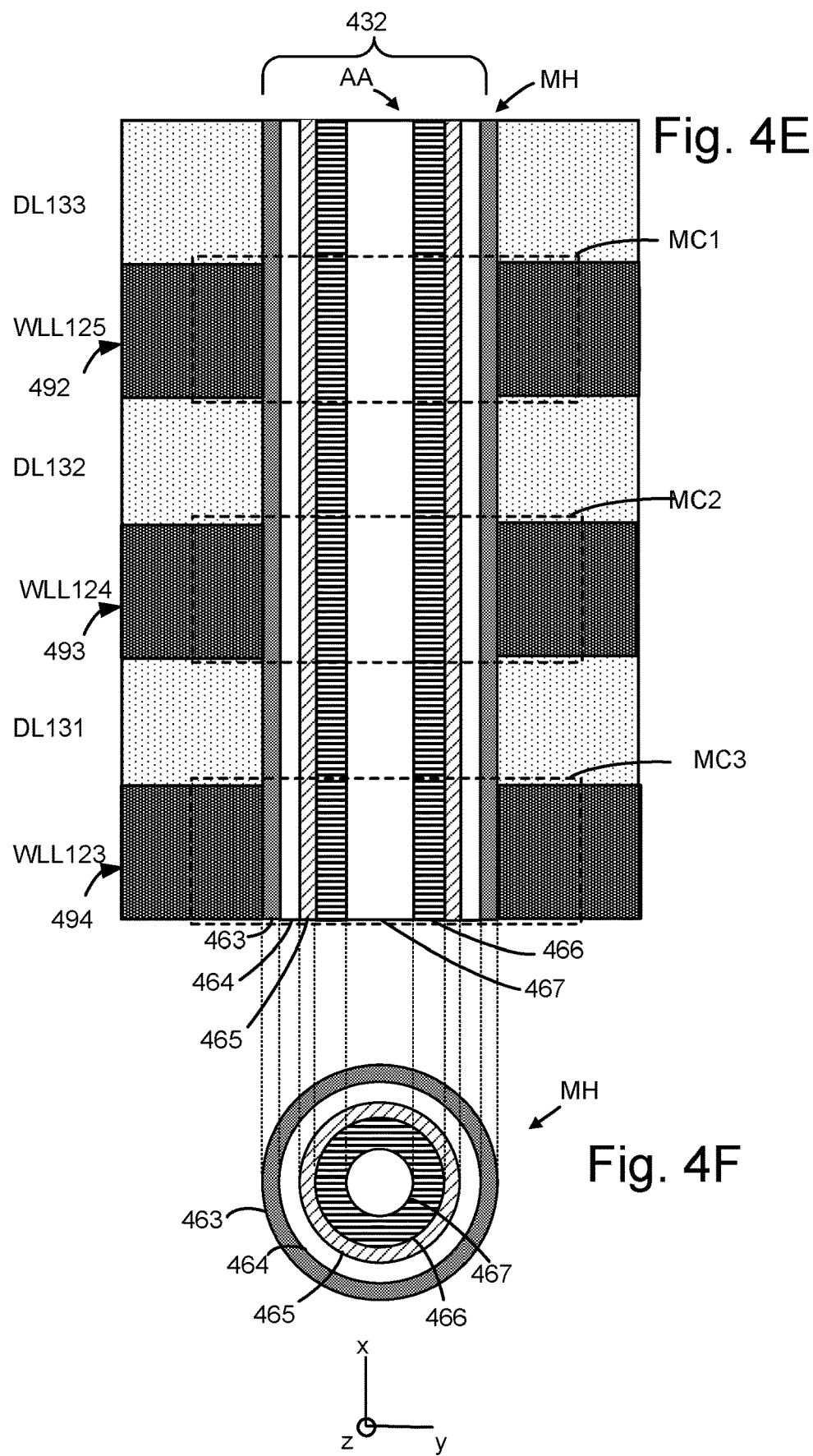

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

US 10,734,084 B2

SCHEME TO REDUCE READ DISTURB FOR HIGH READ INTENSIVE BLOCKS IN NON-VOLATILE MEMORY

PRIORITY CLAIM

This application claims priority to Indian Provisional Patent Application No. 201841020420, filed May 31, 2018, which is incorporated herein by reference.

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in or connected to an electronic device (the host), the memory system can be used to store data and read data. It is important that writing and reading is performed accurately, so that data is not lost. Over time the integrity of the stored data may suffer due to effects such as read disturb. Read disturb is a phenomenon in which reading memory cells disturbs the data stored in either the read data cells or other data cells not presently being read. Effects such as read disturb can cause what is referred to as a failed bit. A failed bit means that a value of a bit that is read is flipped from the value that was stored. The memory system is able to correct for some of the failed bits by use of an error correction algorithm, which is used to decode the data.

Read scrub is a technique that re-writes data from time to time, with a goal of re-writing the data prior to the data integrity becoming so poor that the data cannot be successfully decoded. One read scrub technique is to read the data, use an error correction algorithm to correct any failed bits (or flipped bits) in the data, and then re-write the data. The data could be re-written to a different location than the location from which it was read.

BRIEF DESCRIPTION OF THE DRAWINGS

Like-numbered elements refer to common components in the different Figures.

FIG. 2 is a block diagram of one embodiment of a memory die.

FIG. 4D depicts a view of the select gate layers and word line layers.

FIG. 4E is a cross sectional view of a vertical column of memory cells.

FIG. 4F depicts a cross section (in an x-y plane) of memory hole 432 of FIG. 4E.

DETAILED DESCRIPTION

Techniques are disclosed herein to reduce read disturb in high read intensive blocks of non-volatile memory cells. In some embodiments, high read intensive blocks are written with a scheme that reduces read disturb. Reducing read disturb of high read intensive blocks may substantially reduce the frequency at which read scrub is performed on the high read intensive block. Reducing the frequency of read scrub helps to improve the useful lifetime of the memory system.

The terms "logical block" and "physical block" will be used herein. Each logical block has a logical block address (LBA). Each physical block has a physical block address (PBA). The memory system keeps a mapping between logical blocks and physical blocks, in some embodiments. The mapping between logical blocks and physical blocks may change over time. For example, the data for a logical block may be moved from one physical block to another physical block. As one particular example, when read scrub is performed the data for a logical block may be read from one physical block, any failed bits corrected, and then the corrected data may be written to another physical block. After a read scrub, the logical block address remains the same, but the physical block address changes, in some embodiments. Note that it is possible to re-write the data in place, in which case the PBA will not change after a read scrub. Thus, a physical block refers to the physical memory cells in which the data is stored. A logical block address may be thought of as an abstraction that allows the memory system to keep a consistent memory address for a host even though the physical location of the data may change.

A high read intensive block is defined herein with respect to the logical blocks, in some embodiments. A high read intensive block is defined herein as a logical block for which the read intensity is greater than a threshold. Read intensity is based on the number to reads of the physical block(s) associated with the logical block. Although tracking the total number of reads is one way to quantify read intensity, tracking the total number of reads is not required. One technique for measuring (or quantifying) the read intensity is based on the frequency with which read scrub is performed on the physical block(s) associated with the logical block. However, other techniques may be used for measuring the read intensity of a logical block.

Figure 1A:
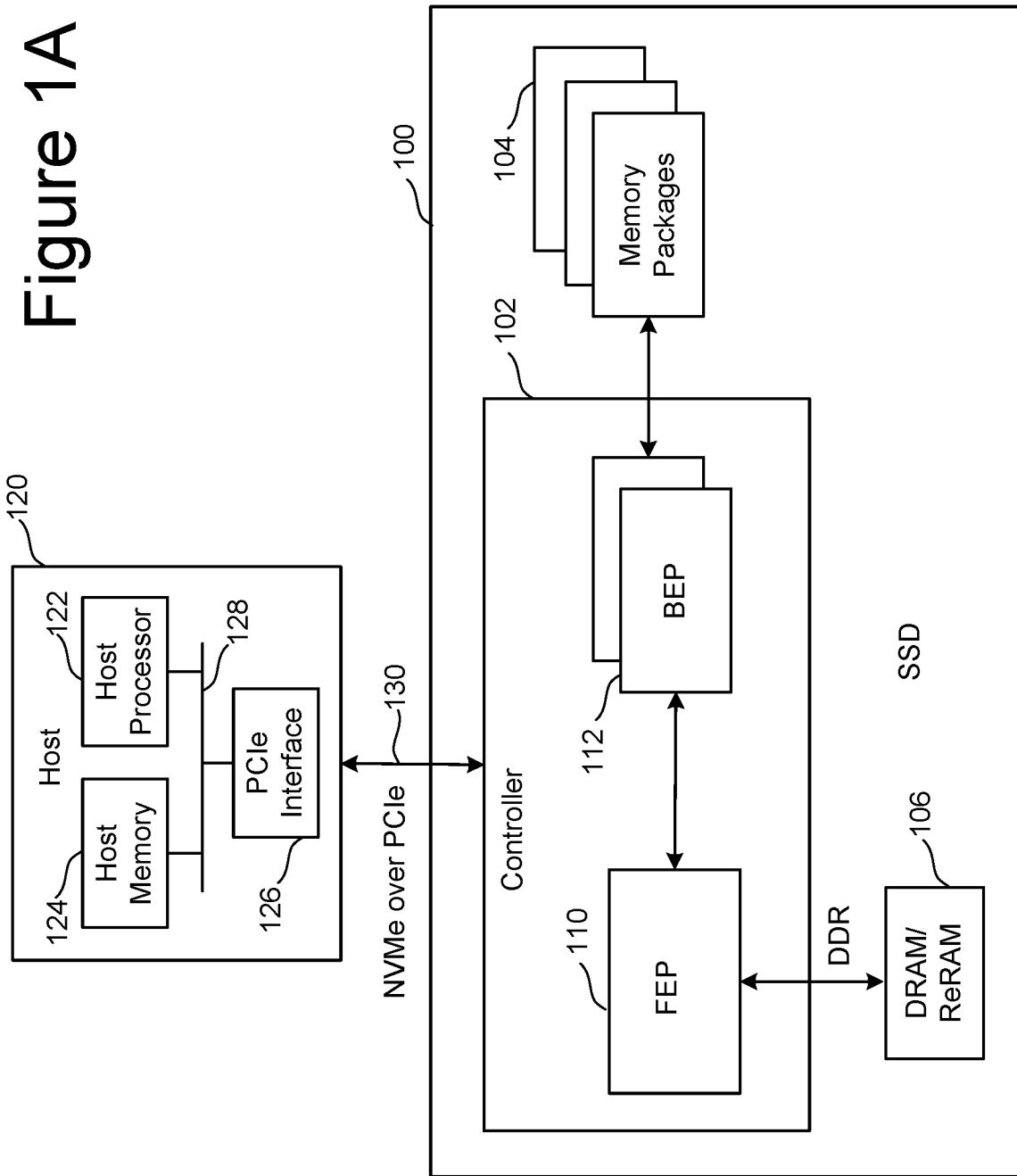
FIG. 1A is a block diagram of one embodiment of a memory system connected to a host.

FIG. 1A is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
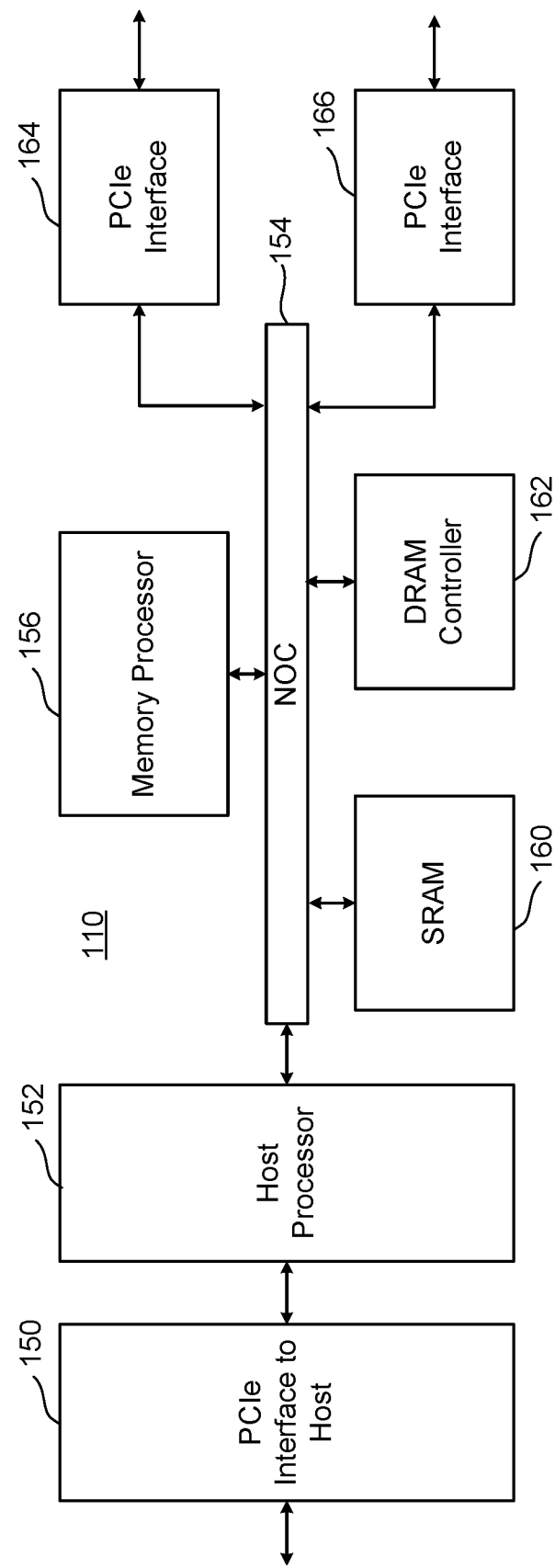
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
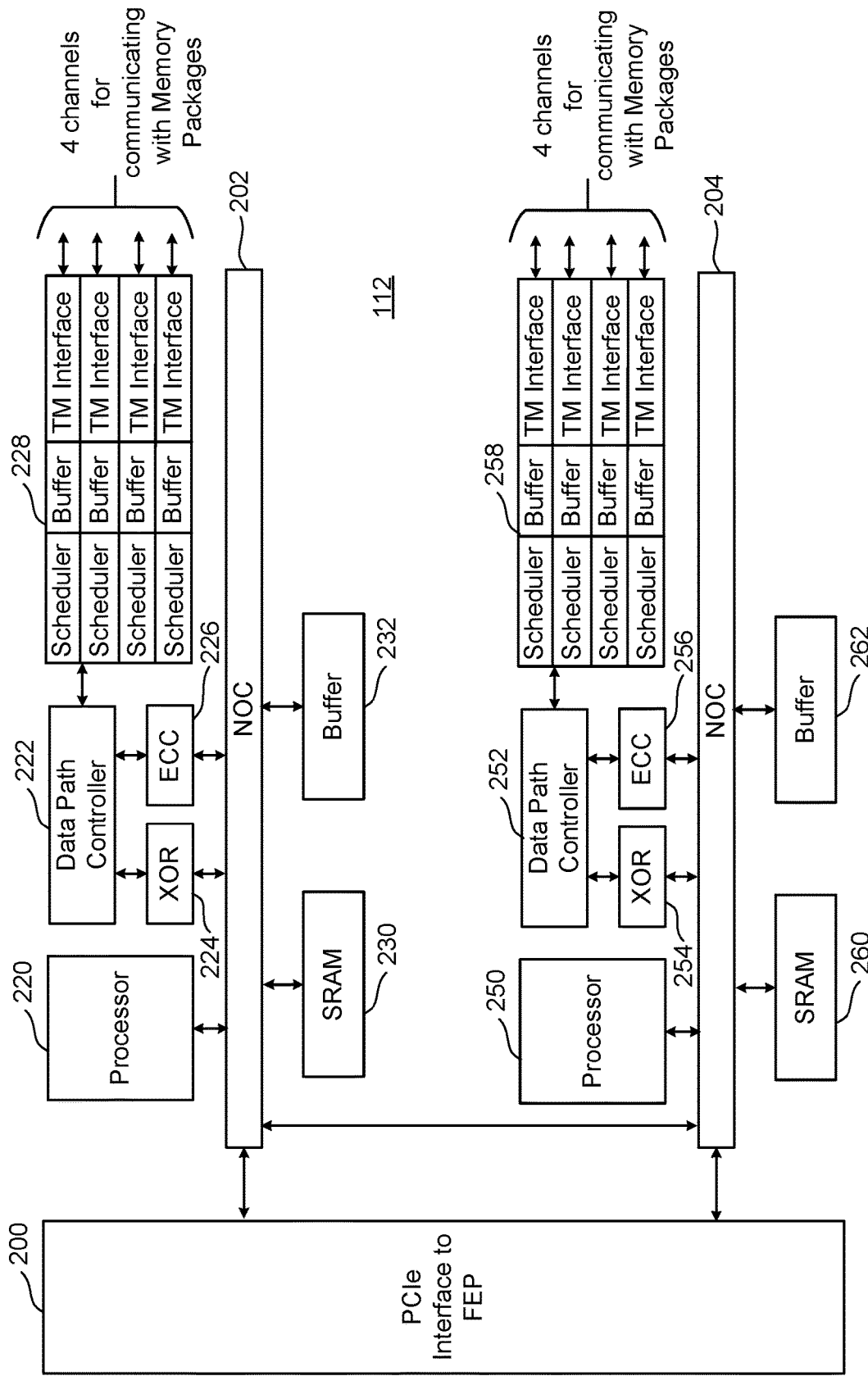
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
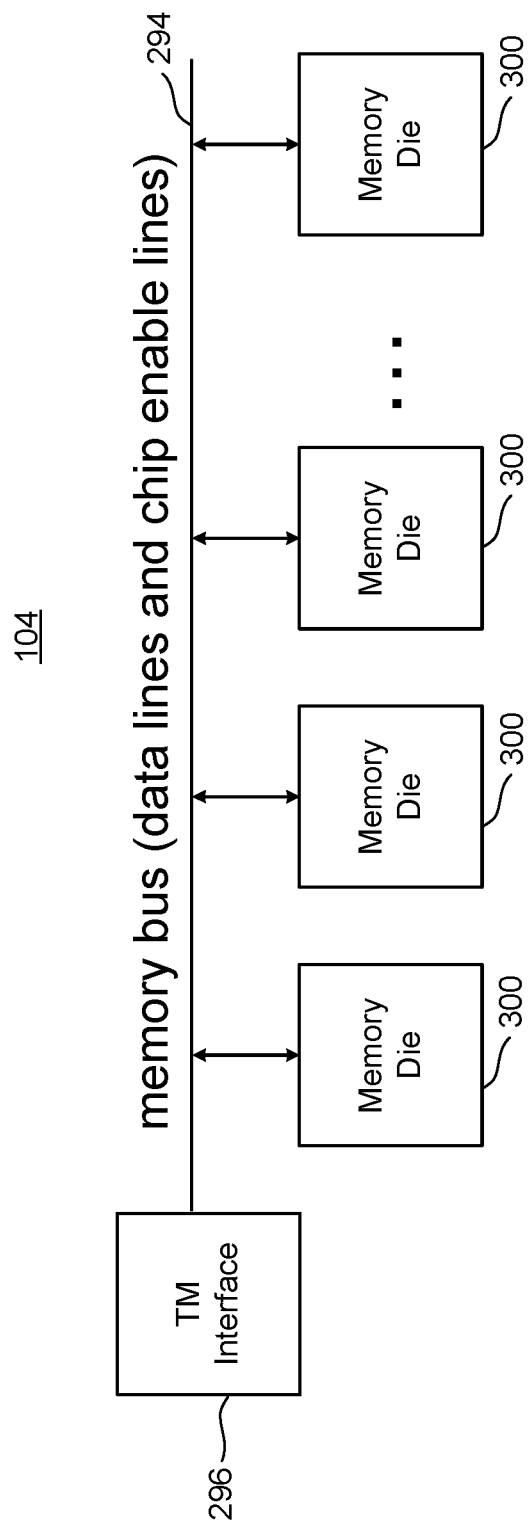
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuitry 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
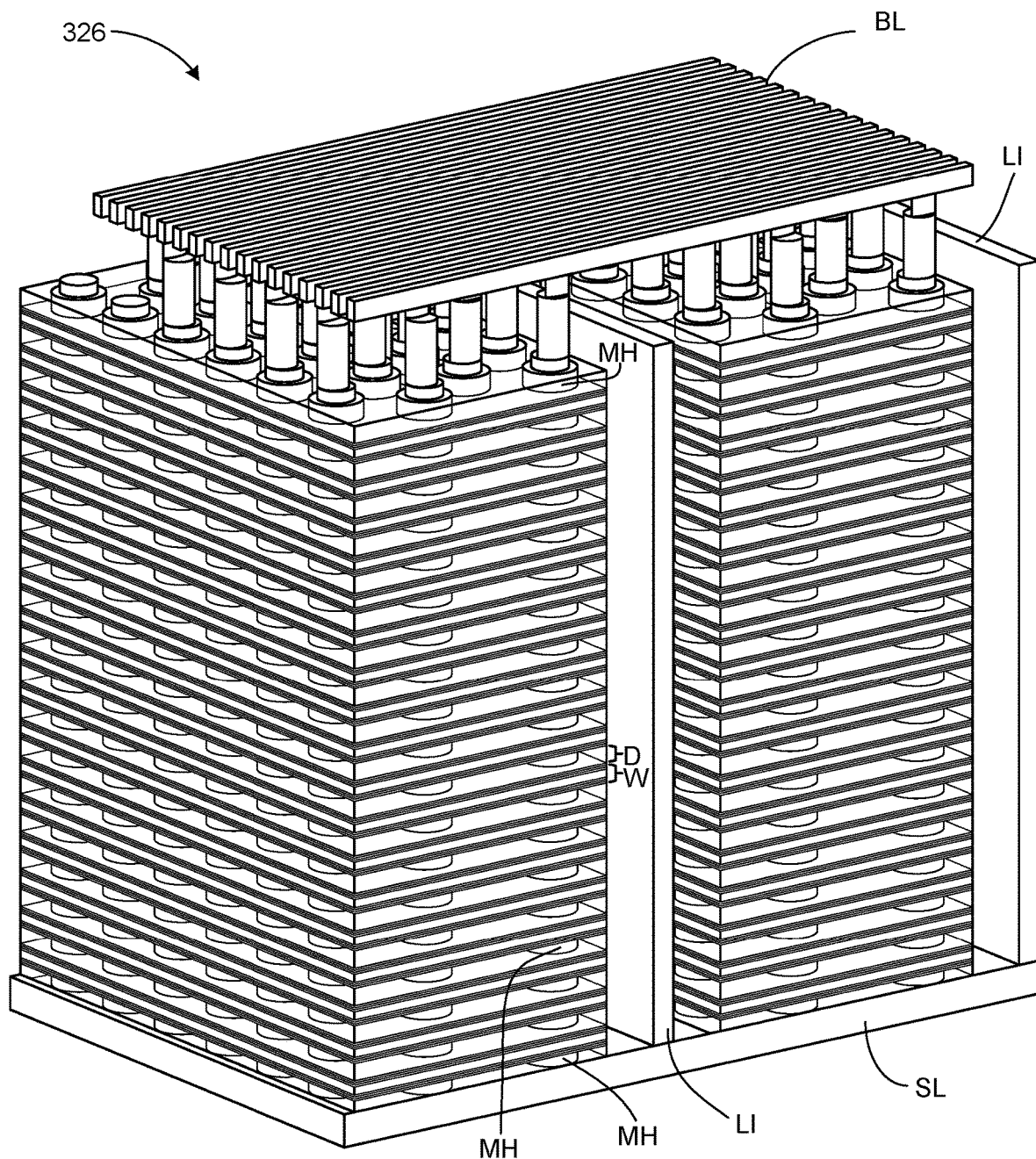
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

Herein, different writing schemes are disclosed. One writing scheme is referred to as a "normal" writing scheme. A data word line layer (or data word line in a block) is defined herein as a layer in which either user data or system data may be stored in a normal writing scheme. A dummy word line layer (or dummy word line in a block) is defined herein as a layer that is not eligible to store either user data or system data in a normal writing scheme. Other writing schemes disclosed herein reduce read disturb, and are not defined as being a normal writing scheme. When using a scheme to reduce read disturb, dummy data may be stored in some of the word lines that are designated as data word lines for the normal writing scheme. It will be understood that a word line that is designated as a data word line when using the "normal" writing scheme will be referred to herein as a data word line when using a scheme that reduces read disturb, even if dummy data is stored in the word line. A data memory cell is defined herein as a memory cell connected to a data word line, and a dummy memory cell is defined herein as a memory cell that is connected to a dummy word line.

Further, the term "user/system" data, as used herein, refers to "user data" or to "system data." The user data refers to data that a user of the memory system stores and reads from the memory structure 326. The system data refers to data that the memory system stores to and reads from the memory structure 326, and in general is not read by the user. However, even if the user is able to access such system data, that does not change its characterization as user/system data. The term user/system excludes "dummy data." Dummy data refers to any data that is written to group of memory cells that does not contain useful information. Dummy data does not include user/system data. Note that the dummy data could include a pattern such as alternating "1s" and "0s", or having all memory cells programmed to a minimum threshold voltage. However, such patterns are considered useful information for purposes of the definition of dummy data.

More or fewer than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MK Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory array that comprises memory structure 326 is provided below with respect to FIG. 4A-4G.

Due to limitations of the fabrication process, the memory holes (MH) might not be uniform in cross sectional shape from top to bottom of the memory structure 326. For example, the memory holes could, in general, have a smaller cross sectional area closer to the source line (SL). As will be explained below, the diameter of the memory holes may impact read disturb. Some embodiments factor in the diameter of the memory holes when determining a write scheme for read intensive data.

Figure 4A:
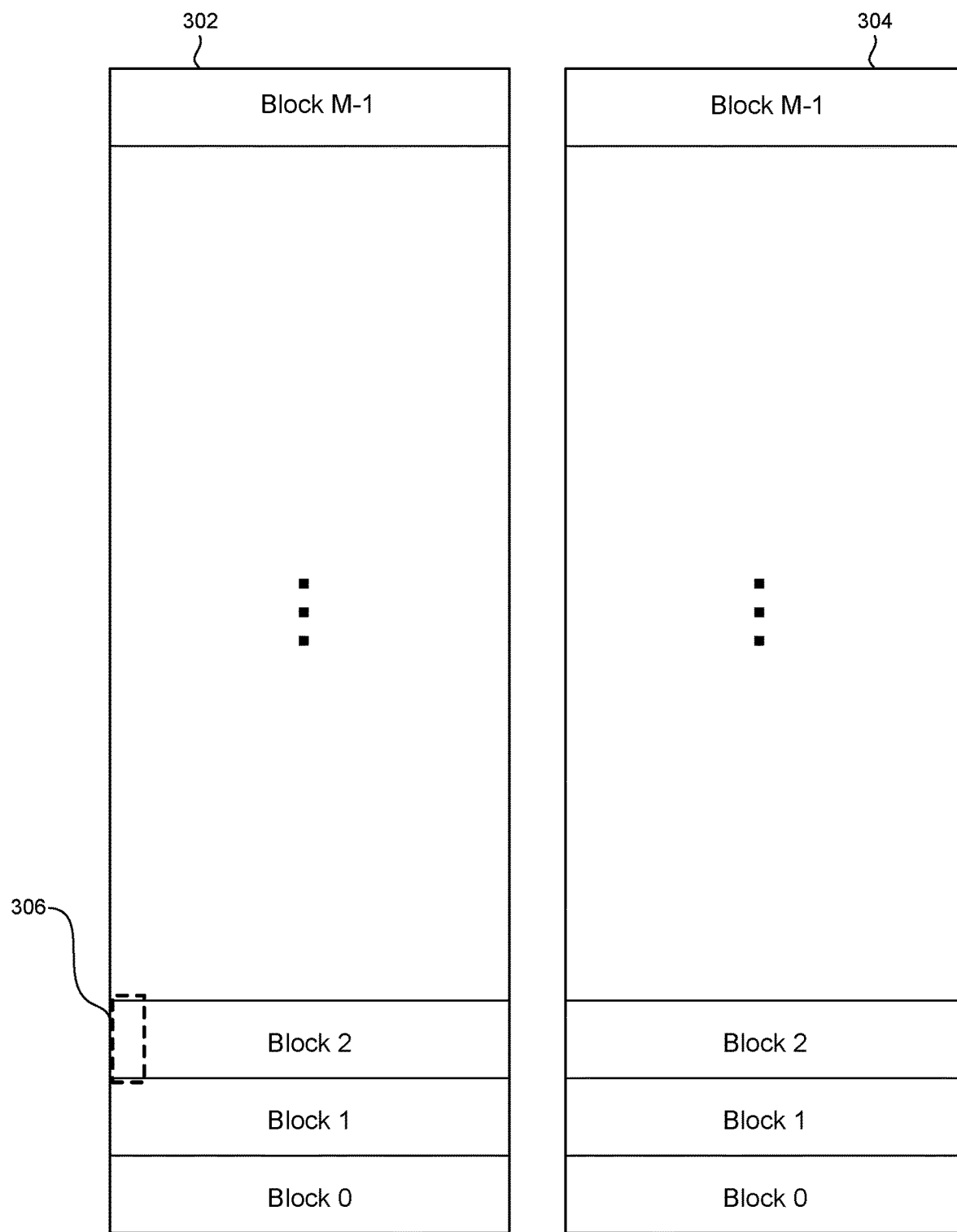
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 4B:
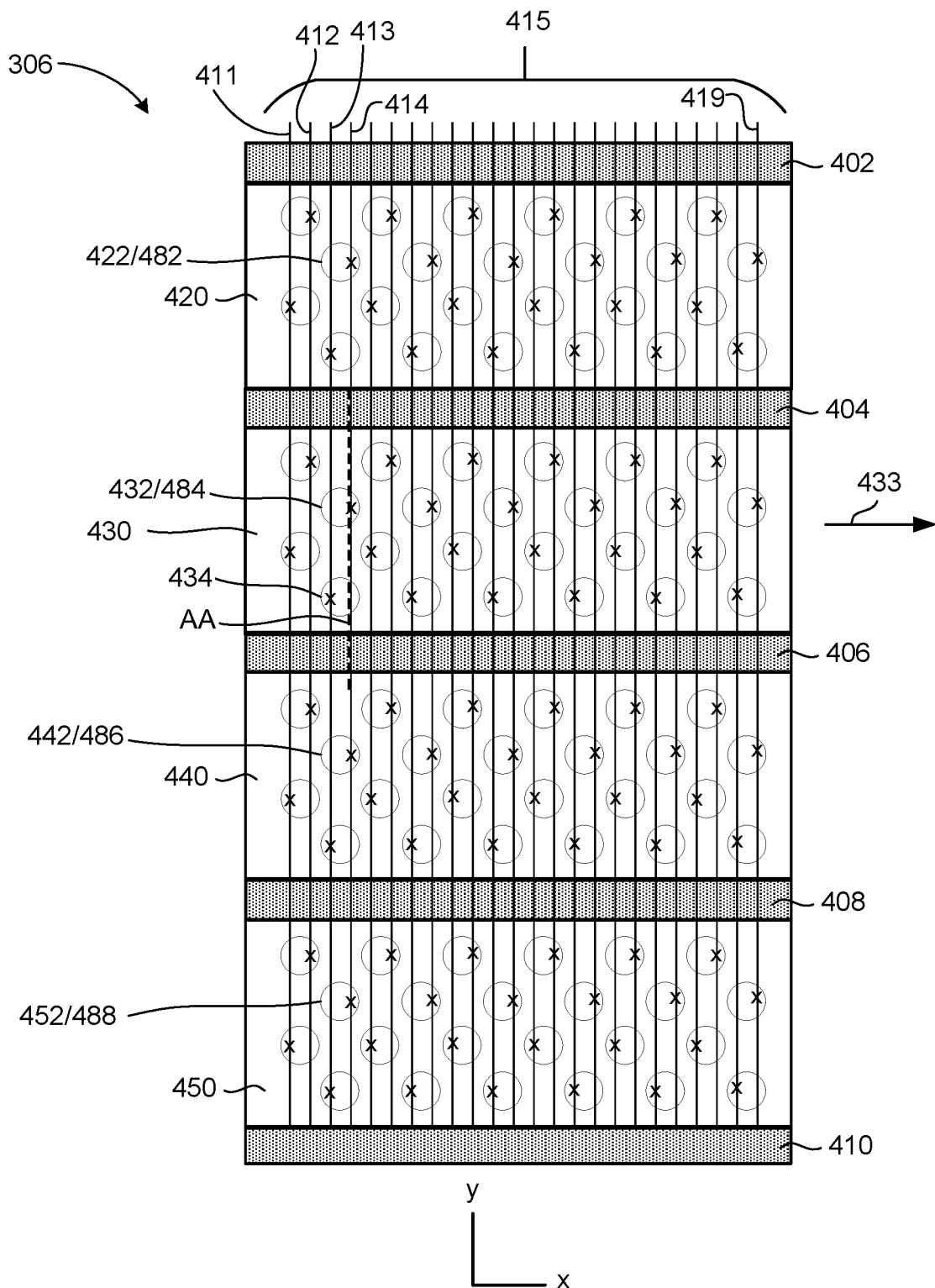
FIG. 4B depicts a top view of a portion of a block of memory cells.

FIGS. 4B-4G depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 433. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines may be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
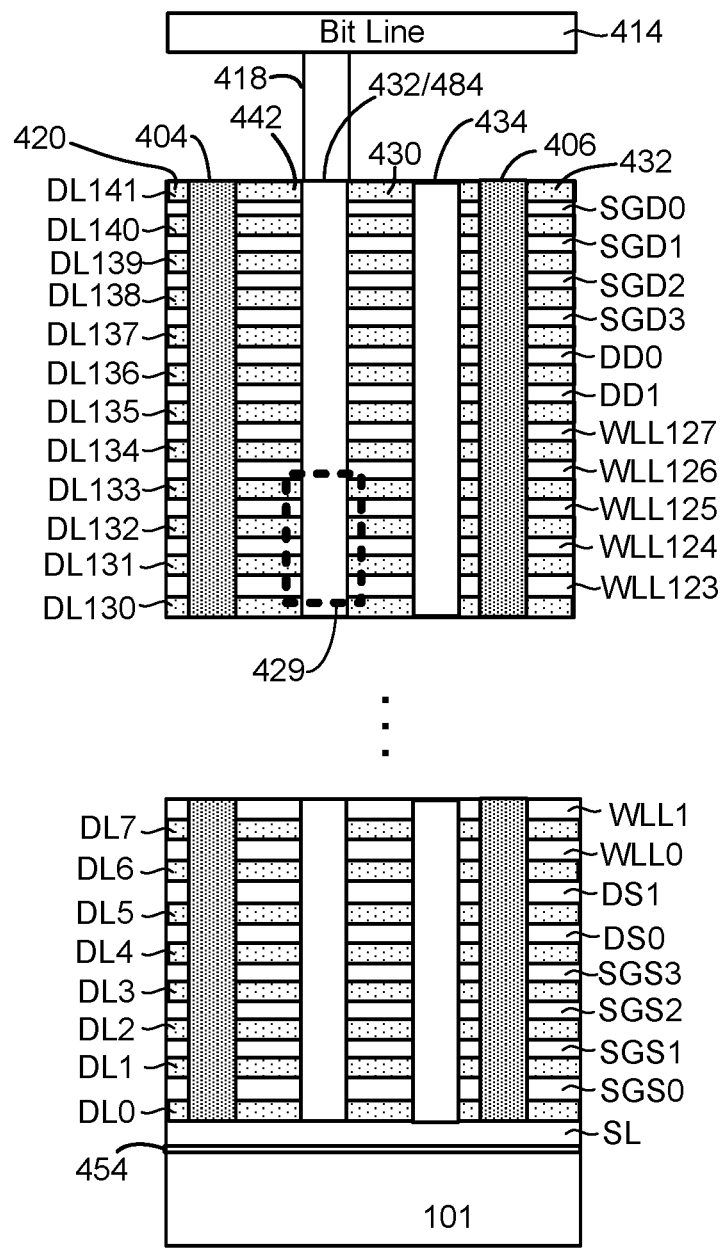
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty eight data word line layers WLL0-WLL127 for connecting to data memory cells. Other embodiments can implement more or less than four drain side select layers, more or less than four source side select layers, more or less than four dummy word line layers, and more or less than one hundred and twenty eight word line. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 418. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL126 is divided into regions 451, 453, 455 and 457. For word line layers (WLL0-WLL127), the regions are referred to as word line fingers; for example, word line layer WLL126 is divided into word line fingers 451, 453, 455 and 457. For example, region 451 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a view of the region 429 of FIG. 4C. FIG. 4F depicts a cross section (in an x-y plane) of memory hole 432 of FIG. 4E. FIG. 4E depicts dielectric layers DLL131, DLL132, DLL133, as well as word line layers WLL123, WLL124, WLL125. In one embodiment, the vertical columns are round; however, in other embodiments other shapes can be used. Region 429 contains several memory cells MC1, MC2, MC3. The physical interaction of the word line layers with the vertical column forms the memory cells.

The memory hole 432 includes a number of memory cell films 463-467. For example, each column (e.g., the pillar which is formed by the materials within a memory hole) can include a blocking oxide/block high-k material 463, charge-trapping layer or film 464 such as SiN or other nitride, a tunneling layer 465, a polysilicon body or channel 466, and a dielectric core 467. A word line layer can include a conductive metal such as Tungsten as a control gate. For example, control gates 492, 493 and 494 are provided. In this example, all of the layers except the metal are provided in the memory hole. In other approaches, some of the memory film layers can be in the control gate layer. Thus, the memory hole 432 could contain fewer (or more) memory film layers than are shown in FIGS. 4E and 4F. Also note that some of the depicted layers may be formed from one or more layers. Additional pillars are similarly formed in the different memory holes. A pillar can form a columnar active area (AA) of a NAND string.

When a memory cell transistor is programmed, electrons are stored in a portion of the charge-trapping layer 464 which is associated with the memory cell transistor. These electrons are drawn into the charge-trapping layer from the channel 466, and through the tunneling layer 465. The Vt of a memory cell transistor is increased in proportion to the amount of stored charge. During an erase operation, the electrons return to the channel. Non-data transistors (e.g., select transistors, dummy memory cell transistors) may also include the charge trapping layer 464. Thus, the threshold voltage of at least some non-data transistors may also be adjusted by storing or removing electrons from the charge trapping layer 464. It is not required that all non-data transistors have an adjustable Vt. For example, the charge trapping layer 464 is not required to be present in every select transistor.

In some embodiments, the memory hole is formed by drilling (or etching) holes into a stack of alternating layers (e.g., alternating layers of a conductive material and a sacrificial material). The term "memory hole" may be used to refer to both the empty region that exists after drilling (or etching) holes into the stack or to the region after it has been filled with the memory cell film. The memory cell films may be deposited on the sidewall of the memory hole. For example, first the blocking layer 463 may be deposited on the memory hole sidewall using atomic layer deposition, or another deposition technique. Then, then charge trapping layer 464 may be deposited over the blocking layer 463. Next, the tunneling layer 465 may be deposited over the charge trapping layer 464. In some cases, the tunneling layer 465 can comprise multiple layers such as in an oxide-nitride-oxide configuration. Then, the body 466 may be deposited over the tunneling layer 465. Note that it is the body 466 that connects to the bit line and the source line. Then, the dielectric core 467 may be formed within the body 466. Other techniques may be used to form the memory cell film. The technology described herein is not limited to any particular material or structure.

Figure 12:
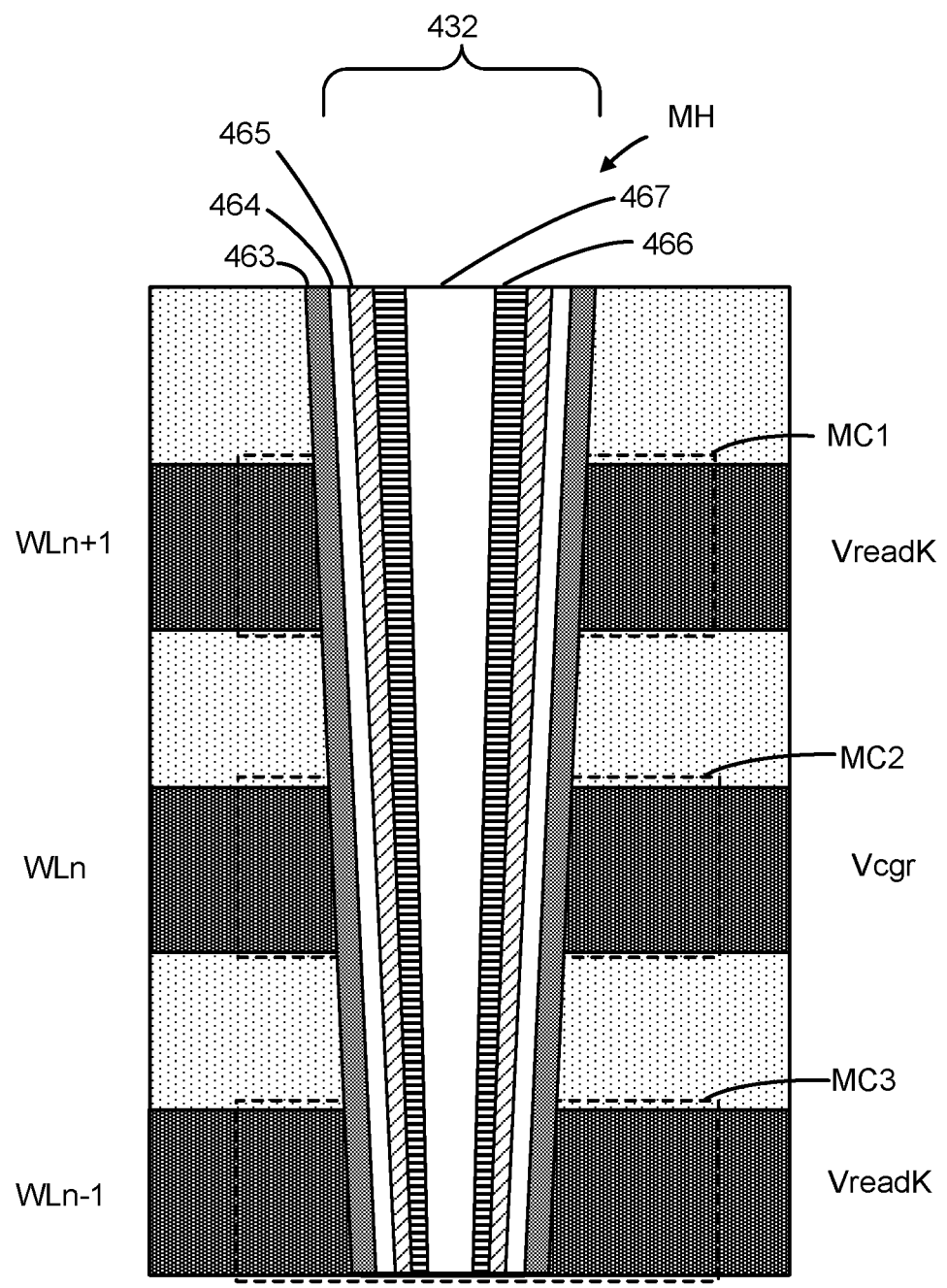
FIG. 12 depicts an example of a memory hole that tapers.

Note that although the diameter of the memory hole 432 is depicted as being relatively uniform from DL133 to WLL123, there may be some tapering of the memory hole (which may also be stated as tapering of the column). Briefly, FIG. 12 depicts an example in which the memory hole 432 tapers. In other words, the column has a diameter that varies depending on location of the non-volatile memory cells along the column. As will be discussed below, the tapering of the memory hole may result in read disturb impacting some word line layers more severely than others. For example, memory cells formed in memory holes having a smaller diameter may be more susceptible to read disturb. In some embodiments, a write scheme is selected for high read intensive blocks based on the diameter of the memory holes.

Figure 4G:
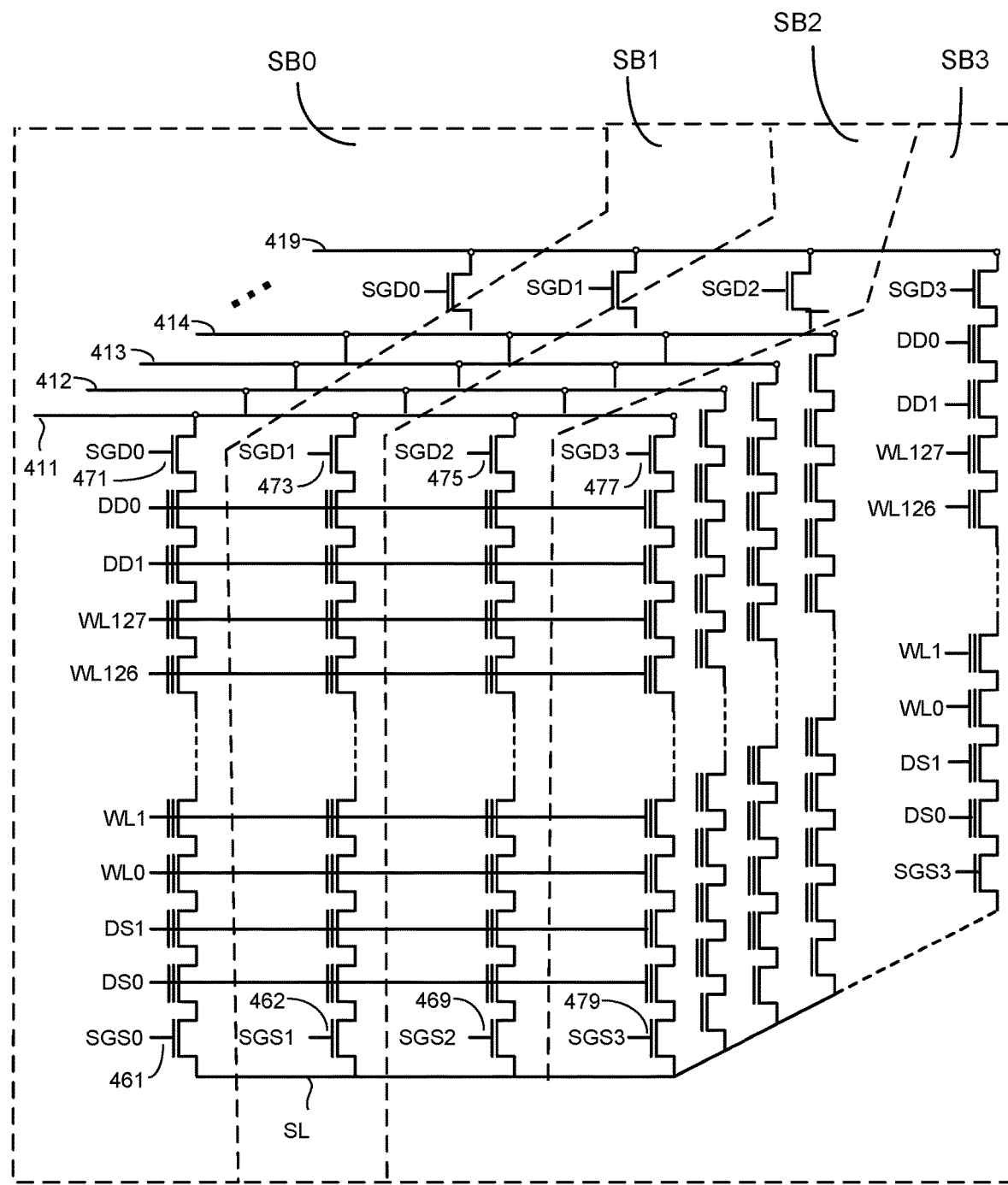
FIG. 4G is a schematic of a plurality of NAND strings.

FIG. 4G is a schematic diagram of a portion of the memory depicted in in FIGS. 3-4F. FIG. 4G shows physical word lines WLL0-WLL127 running across the entire block. The structure of FIG. 4G corresponds to portion 306 in Block 2 of FIGS. 4A-F, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). The transistors 471, 473, 475, 477 connected to the drain side selection lines SGD0, SGD1, SGD2 and SGD3 are drain side select gates. Source side selection lines SGS0, SGS1, SGS2 and SGS3 are used to determine which of the four NAND strings connect to the common source line. The transistors 461, 462, 469, 479 connected to the source side selection lines SGS0, SGS1, SGS2 and SGS3 are source side select gates. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4G is a three dimensional memory structure that includes vertical NAND strings with charge-trapping material, other (2D and 3D) memory structures can also be used with the technology described herein.

Figures 5, 6:
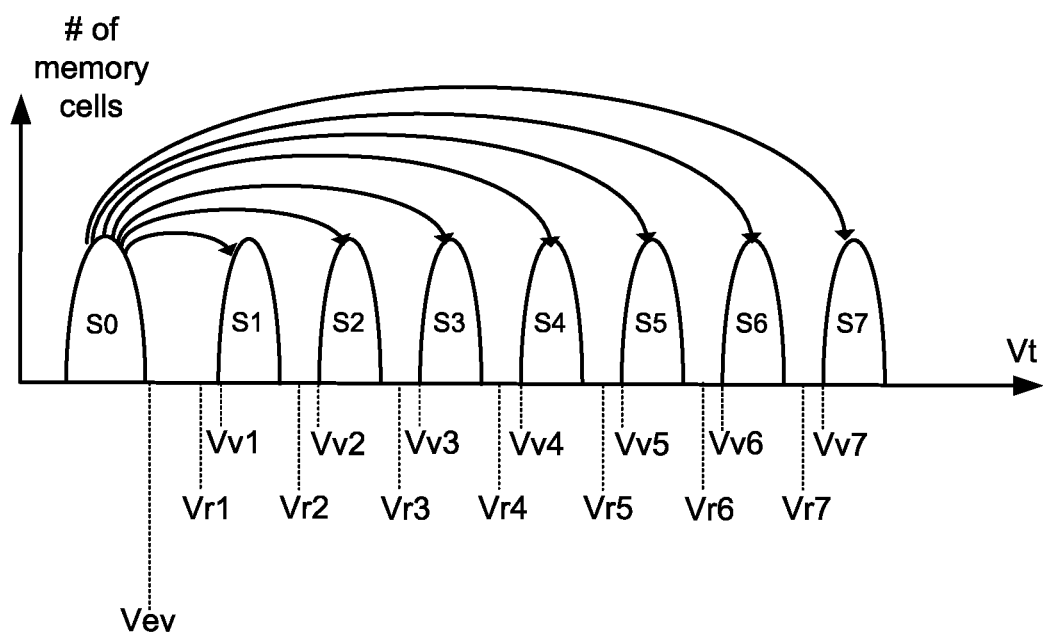
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). Storing more than one bit of data per memory cell is referred to a MLC. Storing one bit of data per memory cell is referred to a SLC. FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 102 relying on error correction to identify the correct data being stored.

FIG. 6 is a table describing one example of an assignment of data values to data states. In the table of FIG. 6, S0=111, S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cells are erased (e.g., in data state S0).

Figure 7:
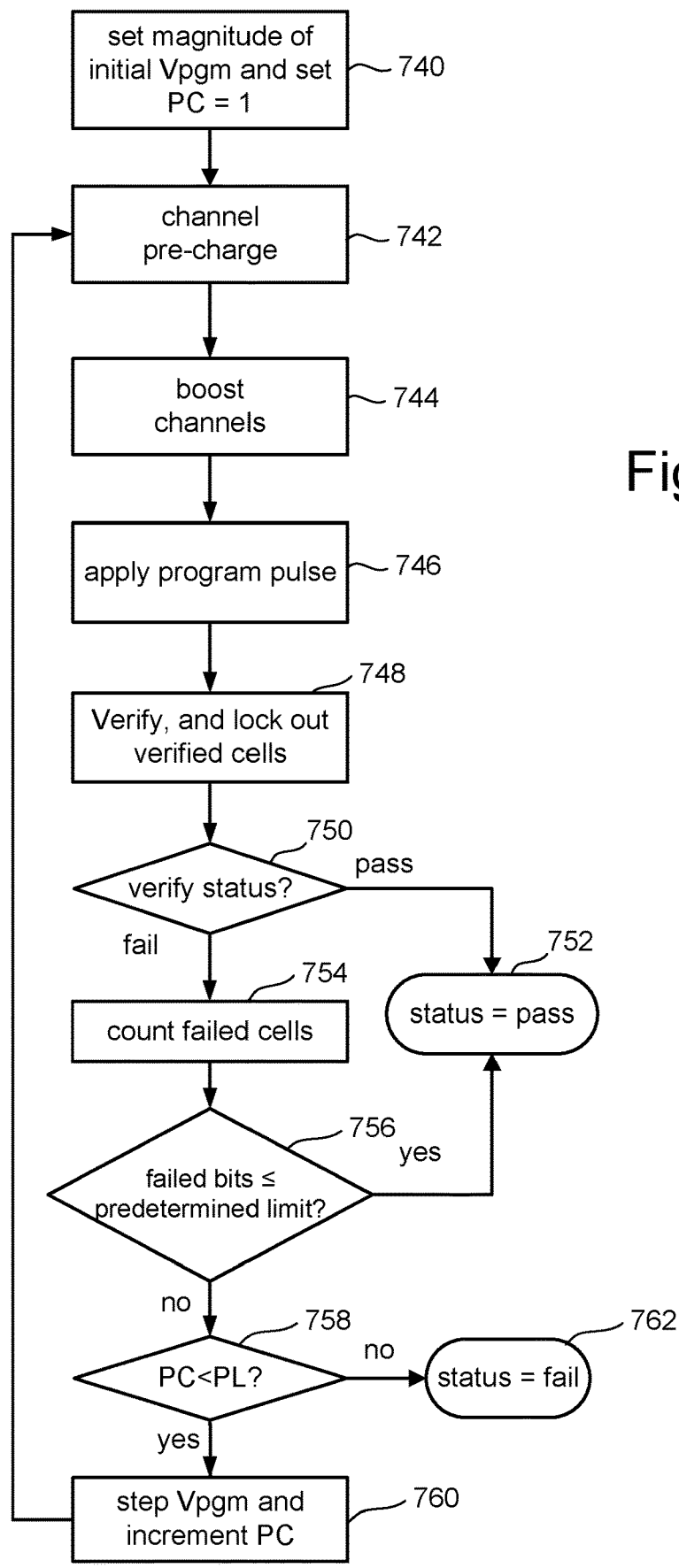
FIG. 7 is a flow chart describing one embodiment of a process for programming.

FIG. 7 is a flow chart describing one embodiment of a process for programming. In some embodiments, data is programmed (written) in pages and read in pages. In one embodiment, a page includes all data stored in memory cells connected to a common word line. In one embodiment, a page includes one bit of data stored in each memory cell connected to a common word line. In one embodiment, a page includes all data stored in a subset of memory cells connected to a common word line. In one embodiment, a page includes all (or one bit of) data stored in memory cells of the same sub-block connected to a common word line. In one example embodiment, the process of FIG. 7 is performed on memory die 300 using the control circuit discussed above. For example, the process of FIG. 7 can be performed at the direction of state machine 312.

Typically, the program voltage applied to the control gates (via a selected word line) during a program operation is applied as a series of program pulses. Between at least some of the programming pulses are a set of verify pulses to perform verification. In many implementations, the magnitude of the program pulses is increased with each successive pulse by a predetermined step size. In step 740 of FIG. 7, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 742 the memory system will pre-charge channels of NAND strings that include memory cells connected to the selected word line that are to be inhibited from programming. In some embodiments, the channel is pre-charged from the drain end of the NAND string. By "drain end" it is meant the end of the NAND string connected to the bit line. In some embodiments, the channel is pre-charged from the source end. By "source end" it is meant the end of the NAND string connected to the source line. In some embodiments, the channel is pre-charged from both the drain end and the source end.

In step 744, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string. This allows the boosting voltages to boost the potential of the NAND channel.

In step 746, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string." In step 746, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 748, memory cells that have reached their target states are locked out from further programming. Step 748 may include performing verifying at one or more verify reference levels. In one embodiment, the verification process is performed by testing whether the threshold voltages of the memory cells selected for programming have reached the appropriate verify reference voltage. The verify reference voltage is at a lower tail of the target state, in one embodiment. As used herein "lower tail" refers to a portion of distribution between its lowest threshold voltage level and the threshold voltage level at the apex of the distribution. Similarly, as used herein "upper tail" refers to a portion of distribution between its highest threshold voltage level and the threshold voltage level at the apex of the distribution.

In step 748, a memory cell may be locked out after the memory cell has been verified (by a test of the Vt) that the memory cell has reached its target state.

If, in step 750, it is determined that all of the memory cells have reached their target threshold voltages (pass), the programming process is complete and successful because all selected memory cells were programmed and verified to their target states. A status of "PASS" is reported in step 752. Otherwise if, in 750, it is determined that not all of the memory cells have reached their target threshold voltages (fail), then the programming process continues to step 754.

In step 754, the memory system counts the number of memory cells that have not yet reached their respective target threshold voltage distribution. That is, the system counts the number of memory cells that have, so far, failed to reach their target state. This counting can be done by the state machine, the controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 756, it is determined whether the count from step 754 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 752. In this situation, enough memory cells programmed correctly such that the few remaining memory cells that have not been completely programmed can be corrected using ECC during the read process. In some embodiments, the predetermined limit used in step 756 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 758 and the program counter PC is checked against the program limit value (PL). Examples of program limit values include 7, 12, 16, 19 and 30; however, other values can be used. If the program counter PC is not less than the program limit value PL, then the program process is considered to have failed and a status of FAIL is reported in step 762. If the program counter PC is less than the program limit value PL, then the process continues at step 760 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 760, the process loops back to step 742 and another program pulse is applied to the selected word line so that another iteration (steps 742-660) of the programming process of FIG. 7 is performed.

Figure 8:
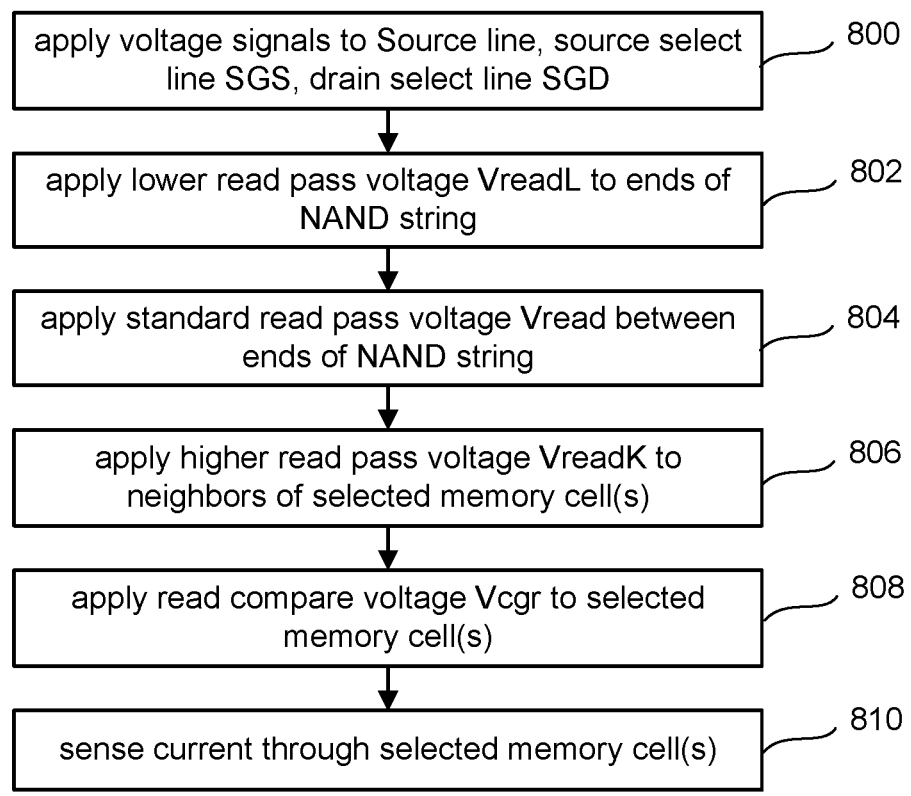
FIG. 8 is a flowchart of one embodiment of a process of reading non-volatile memory cells.

FIG. 8 is a flowchart of one embodiment of a process of reading non-volatile memory cells. Step 800 of FIG. 8 includes applying voltage signals to the source line, source select line SGS and drain select line SGD. In step 802, a lower read pass voltage, VreadL, is applied to memory cells at the ends of the NAND string. In step 804, the standard read pass voltage, Vread, is applied to the middle memory cells, which are those memory cells between the ends of the NAND string that are not selected for reading. In step 806, a higher read pass voltage, VreadK, is applied to those memory cells of the NAND string that are neighbors to the selected memory cell. In step 808, the read compare voltage, Vcgr, is applied to the selected memory cell. In step 810, the system will sense the current through the selected memory cell in response to the voltages applied in steps 800-808.

In many embodiments, the system will read multiple memory cells at the same time. Therefore, the process of FIG. 8 will be performed concurrently on multiple NAND strings of the same block such that multiple memory cells will be read concurrently.

Figure 9:
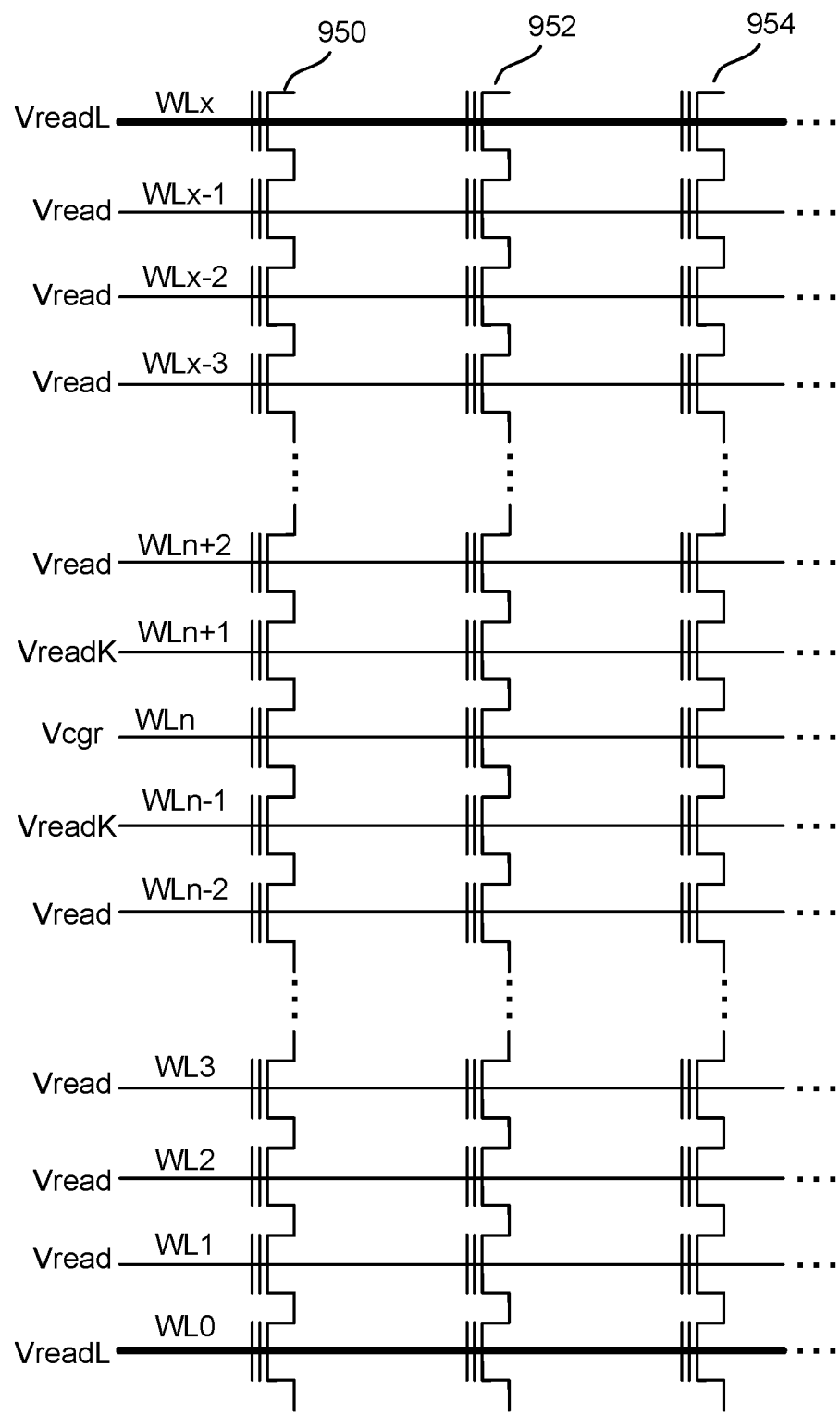
FIG. 9 shows three NAND strings of a block of memory cells implementing the process of FIG. 8.

FIG. 9 shows three NAND strings 950, 952 and 954 of a block of memory cells implementing the process of FIG. 8. In the example embodiment of FIG. 9, a NAND string will include x+1 memory cells. Therefore, the block of NAND strings will include x+1 word lines (WL0-WLx). In the depicted example, word line WLn is selected for reading; therefore, all the memory cells connected to WLn will be read. As per step 808 of FIG. 8, FIG. 9 shows WLn receiving Vcgr, the read compare voltage. As per step 806 of FIG. 8, FIG. 9 shows neighboring word lines WLn−1 and WLn+1 receiving the higher read pass voltage, VreadK. As per step 804 FIG. 8, FIG. 9 shows the word lines (WL1, WL2 . . . WLN−2, WLN+2, . . . WLx−3, WLx−2, WLx−1) that are not connected to end memory cells receiving the standard read pass voltage, Vread. As per step 802 of FIG. 8, FIG. 9 shows the end word lines (in the example, the word lines at the extreme end of the NAND string), WL0 and WLx, receiving the lower read pass voltage VreadL. In this embodiment, the various voltages Vread, VreadL and VreadK are provided to the control gates of the respective memory cells by applying the voltages to the word lines, which are connected to the control gates of memory cells. As seen from FIG. 9, each word line is connected to the control gate of multiple memory cells so that the read and programming operations are performed in parallel.

If any word line in a block is read often, the data in the neighboring word line may get corrupted due to Read Disturb (RD). When a word line WLn is read, a bypass voltage VreadK is applied on the neighboring word lines WLn+1 and WLn−1, in some embodiments. VreadK is Vread+dvreadk (offset). Other unselected WLs have Vread (or VreadL on source side and drain side). Since VreadK>Vread, a weak programming may happen on the neighboring word lines (WLn−1 and WLn+1). Therefore, the optimum read levels may shift towards from default levels, especially for Er-A (data states S0-S1) valley point.

Figure 10:
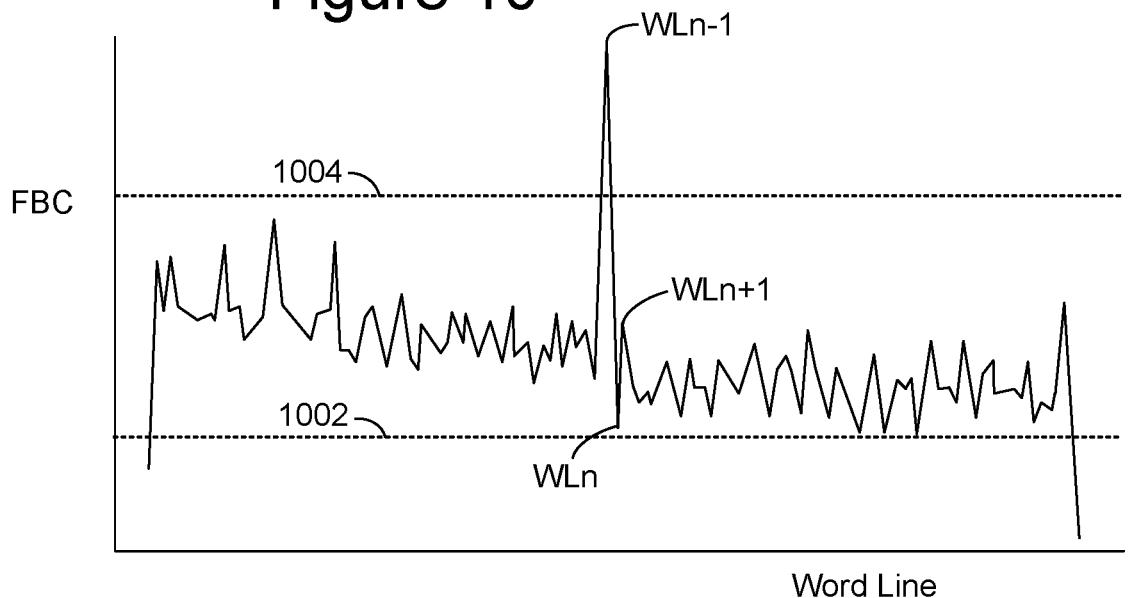
FIG. 10 shows an example plot of fail bit count (FBC) versus word line.

FIG. 10 shows an example plot of fail bit count (FBC) versus word line. The plot shows the effect of read disturb on each of the word lines after many reads of a selected word line (WLn). In particular, the plot is used to demonstrate an impact of read disturb on word lines that neighbor the selected word line. The two neighboring word lines are word line WLn−1 (closer to the source line) and WLn+1 (closer to the bit line). The FBC of the neighboring word lines are high relative to the selected word line (WLn).

The memory controller 102 has an ability to correct a certain number of "failed bits" using its error correction engine. Line 1002 represents a number of bits that can be corrected using a first error correction algorithm. Line 1004 represents a number of bits that can be corrected using a second error correction algorithm. Although the second error correction algorithm can correct more failed bits, the second error correction algorithm typically takes more time to converge. When the read disturb is too high, the first error correction algorithm is not able to correct the data. In most cases, the second error correction algorithm can correct the data. However, even the second error correction algorithm may be unable to correct the data for WLn−1 in this example. Hence, read scrub may need to be performed at a much higher frequency in order to be able to successfully decode the data in WLn−1.

Figure 11:
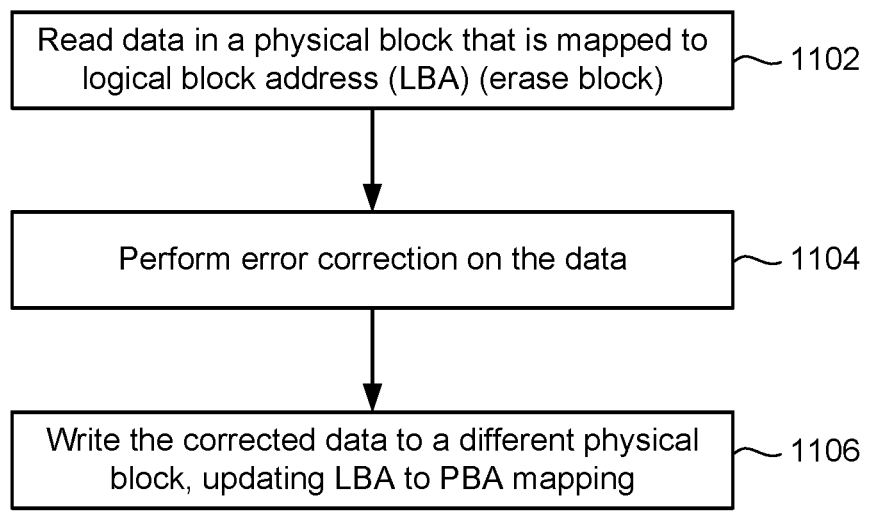
FIG. 11 is a flowchart of one embodiment of a read scrub.

Read scrub may be used to address the read disturb issue. Read scrub is a conservative approach in which the data on the verge of going beyond the system's error correction capability due to read disturb is identified. The identified data is moved to a fresh block, in some embodiments. FIG. 11 is a flowchart of one embodiment of a read scrub. This process 1100 is invoked in response to identifying a physical block of data that should be scrubbed. One technique for triggering a read scrub is based on a read count with respect to the physical block. Another technique for triggering read scrub is based on a number of failed bits when reading data in the block. However, techniques may be used to trigger a read scrub.

In step 1102, data is read from the physical block. The physical block is associated with a logical block address (LBA), as discussed above. The memory controller 102 contains an LBA to PBA (physical block address) mapping, in some embodiments. After reading the data, the physical block is erased, although the erase may be put off until a later time. The data is transferred to the memory controller 102. Step 1104 includes the memory controller 102 performing error correction on the data. Thus, the memory controller 102 corrects any failed bits.

Step 1106 includes writing the data to a different physical block. Step 1106 also includes updating the LBA to PBA mapping. In other words, the LBA remains the same. Although the data is typically written to a different physical block in step 1106, another alternative is to erase the physical block from step 1102 and re-write the data into the same physical block.

Although read scrub is very useful to protect the integrity of the data, performing read scrub too often may reduce the useful lifetime of the memory device. As can be seen in the flow of FIG. 11, the read scrub process results in an erase of a block and a write of a block. If read scrub us triggered too often, the erasing and programming will negatively impact the write endurance and system performance. High read intensive blocks could potentially undergo a read scrub process a high number of times. Therefore, high read intensive blocks could potentially reduce the useful lifetime of the memory device. However, embodiments are able to increase the useful lifetime of the memory device by reducing the frequency with which high read intensive blocks are scrubbed.

The NAND strings may be formed in memory holes (see FIGS. 3, 4B, 4C, 4E). Due to limitations of the fabrication process, the memory holes might not be uniform in cross sectional shape from top to bottom of the stack. For example, the memory hole may taper. That is, the memory hole may become progressively smaller at one end. FIG. 12 depicts an example of a memory hole that tapers. The amount of taper is exaggerated to help illustrate the effect of tapering. FIG. 12 depicts just a few word lines, showing conditions under which a read reference voltage (Vcgr) is applied to a selected word line (WLn) and VreadK is applied to two neighboring word lines.

In 3D NAND, different WLs may be impacted by read disturb differently because of the change in the diameter along the Memory Hole (MH). When the MH diameter is smaller, the E-field under VreadK stress may be strong (relative to larger MH diameter) resulting in more severe read disturb. Thus, read disturb could be more severe for memory cells with a smaller MH diameter.

The memory hole diameter depends on the location of the word line, in some embodiments. In one embodiment of FIG. 4C, the memory hole diameter is largest at WLL 127 and smallest at WLL0. In some embodiments, the stack is divided into two or more tiers. For example, WLL0-WLL63 may be in a lower tier and WLL64-WLL127 may be in an upper tier. The memory hole diameter may taper in each tier, such that for the upper tier the memory hole diameter is largest at WLL127 and smallest at WLL64, and for the lower tier the memory hole diameter is largest at WLL63 and smallest at WLL0. However, the memory hole diameter at the top of the lower tier (e.g., WLL63) may be larger than the memory hole diameter at the bottom of the upper tier (e.g., WLL64). Thus, read disturb depends on the location of the selected word line, in some embodiments.

Figure 13:
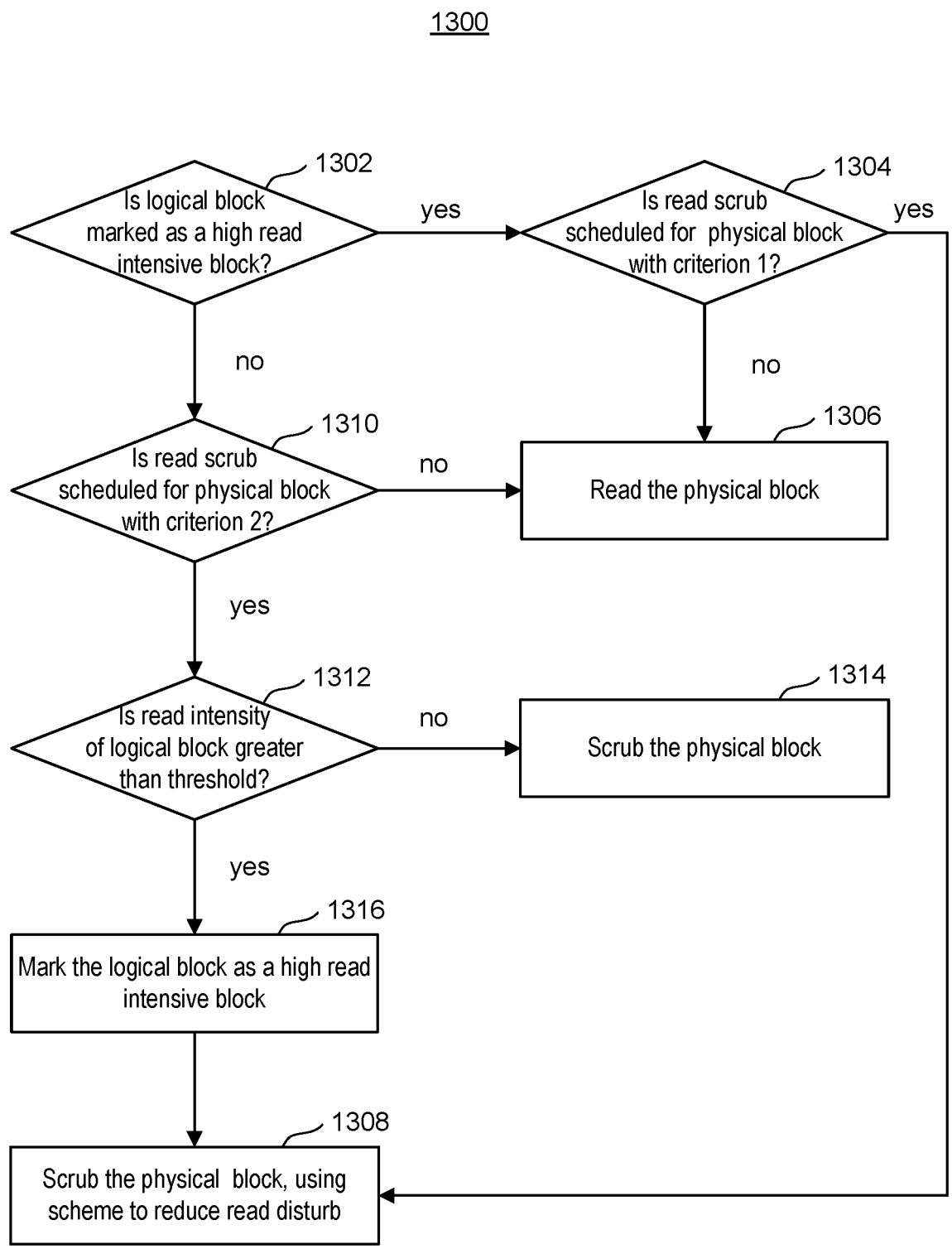
FIG. 13 is a flowchart of one embodiment of a process of reading data from non-volatile memory, and dynamically marking a block as a high read intensive block.
Figure 14:
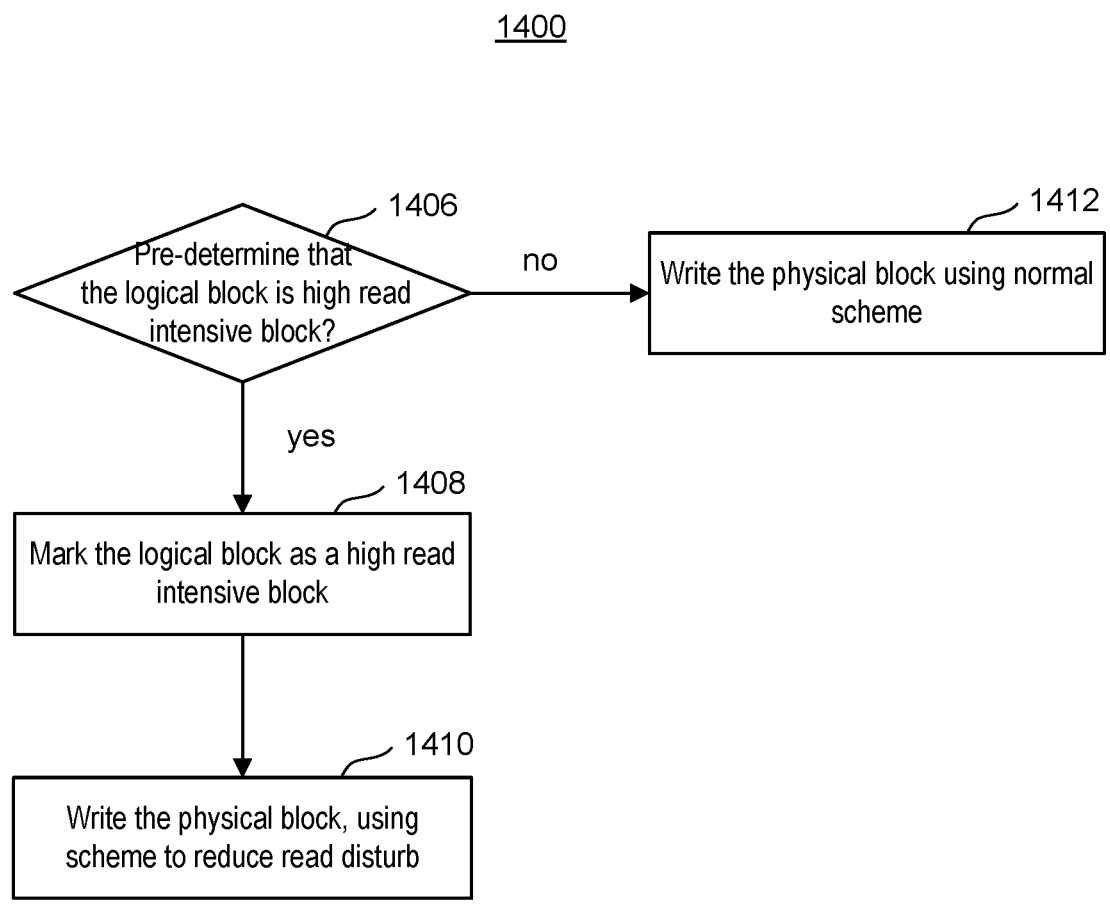
FIG. 14 describes one embodiment for pre-determining that a block is a high read intensive block.

In one embodiment, the controller 102 stores information that indicates whether a logical block is a high read intensive block. The controller 102 dynamically determines whether a logical block is a high read intensive block, in one embodiment. FIG. 13 describes one embodiment for dynamically marking a logical block as a high read intensive block. Certain logical blocks are pre-determined to be high read intensive block, in one embodiment. For example, certain system files will be read many, many times over the lifetime of the memory device. Thus, a logical block that stores such files may be marked as a high read intensive block as early as when the block is first written. FIG. 14 describes one embodiment for pre-determining that a logical block is a high read intensive block FIG. 13 is a flowchart of one embodiment of a process 1300 of reading data from non-volatile memory. The process 1300 may dynamically determine that a logical block is a high read intensive block. The process may be performed by a combination of controller 102, control circuitry 310, read/write circuits 328 and/or decoders 324/332. Process 1300 is performed in response to a determination that a physical block is to be read. For example, the memory controller 102 may receive a request from the host to read data at an LBA. The controller 102 determines a PBA from the LBA, in some embodiments. Thus, the physical block is mapped to a logical block.

One aspect to note about process 1300 is that a different criterion is used to determine whether to scrub the physical block, depending on whether the logical block is a high read intensive block. In words, a read scrub criterion for the physical block is based on the read intensity of the logical block. The criterion is more strict for logical blocks that are not high read intensive blocks, in one embodiment. In other words, the criterion is more relaxed for logical blocks that are high read intensive blocks, in one embodiment. The more relaxed criterion reduces the number of times that the physical blocks that correspond to a high read intensive logical block are scrubbed. However, the physical blocks that correspond to a high read intensive block are written with a scheme that reduces read disturb. This scheme allows the physical blocks that correspond to a high read intensive block to be scrubbed less often, while still being able to decode data stored in those physical blocks.

Step 1302 includes the controller 102 determining whether the logical block is marked as a high read intensive block. In one embodiment, the controller 102 stores a mapping of LBAs to PBAs. Thus, the controller may have a list of LBAs for which data is stored in non-volatile memory. This list indicates whether each LBA is a high read intensive block, in one embodiment. As will be discussed below, the controller 102 may "mark" a logical block as a high read intensive block by storing information on this list. Other techniques may be used to mark a logical block as a high read intensive block.

If then logical block is marked as a high read intensive block, then step 1304 is performed. Step 1304 includes determining whether read scrub is scheduled for the physical block associated with the logical block. By "associated with the logical block" it is meant the physical block to which the logical block presently maps. Note that this determination is made based on what is referred to as "criterion 1". Criterion 1 is more relaxed than criterion 2, in some embodiments. If criterion 1 is not met, then the block is read in step 1306. Note that the block is not scrubbed if criterion 1 is not met. If criterion 1 is met, then step 1308 is performed. By criteria 1 being more relaxed than criterion 2 it is less likely that scrub will be performed under criterion 1. This reduces the frequency of read scrub for the physical block associated with logical block that is marked as a high read intensive block. In one embodiment, criterion 1 and criterion 2 are each read counts of a physical block. In one embodiment, the read count for criterion 1 is higher (and hence more relaxed) than the read count for criterion 2.

Step 1308 includes scrubbing the block, using a write scheme that reduces read disturb. Scrubbing the block may be performed in accordance with process 1100, noting the write in step 1306 will use a scheme that reduces read disturb. Numerous schemes to write a block with a scheme that reduces read disturb are described herein. In some of those schemes, dummy data is stored in data memory cells in the block. For example, dummy data is stored in memory cells on data word lines, in some embodiments. This may reduce the storage capacity of the block. FIGS. 15-21, to be discussed below, show various embodiments of write schemes that reduce read disturb.

Next, a flow starting at step 1302 in which the logical block is not already marked as a high read intensive block will be described. If the logical block is not marked as a high read intensive block, then step 1310 is performed. Step 1310 includes determining whether read scrub is scheduled for the physical block associated with the logical block. Note that this determination is made based on what is referred to as "criteria 2". Criteria 2 is more strict than criteria 1, in some embodiments. If criteria 2 is not met, then the block is read in step 1306. Note that the block is not scrubbed if criteria 2 is not met. If criteria 2 is met, then step 1312 is performed. By criteria 2 being more strict than criteria 1 it is more likely that scrub will be performed. This increases the frequency of read scrub for the physical block associated with logical block that is not marked as a high read intensive block, in some embodiments. Note that this physical block was not written with a scheme that reduces read disturb, in some embodiments. Hence, performing read scrub more frequently may be beneficial to preserve data integrity.

Step 1312 includes a determination of whether a read intensity of the logical block is greater than a threshold. In one embodiment, step 1312 includes a determination of whether a read scrub frequency associated with the logical block is greater than a threshold. The read scrub frequency refers to how often the physical blocks associated with the logical blocks have been scrubbed. The memory controller 102 maintains the read scrub frequency of logical blocks (e.g., LBAs), in one embodiment. The read scrub frequency may be defined by the number of read scrubs over a time period or other interval, as one example. The read scrub frequency may be defined in another manner. If the read scrub frequency is not greater than the threshold, then the physical block is scrubbed in step 1314. Scrubbing the physical block may be performed in accordance with process 1100, noting the write in step 1106 will use a "normal" write. In other words, the write in step 1106 will not use a scheme that reduces read disturb. In one embodiment, the "normal" write stores user/system data on all data word lines in the physical block.

If the read scrub frequency is greater than the threshold, then step 1316 is performed. Step 1316 includes marking the logical block as a high read intensive block. In one embodiment, the controller 102 stores information that marks the logical block as a high read intensive block. For example, the controller 102 may already be maintaining a mapping of LBAs to PBAs. The information may be stored as a part of such mapping information.

If the read scrub frequency is greater than the threshold, then step 1308 is also performed. Step 1308 includes scrubbing the physical block, using a scheme that reduces read disturb. Scrubbing the physical block may be performed in accordance with process 1100, noting the write in step 1106 will use a scheme that reduces read disturb. As noted above, FIGS. 15-21 depict various schemes for writing a block using a scheme that reduces read disturb. Step 1308 is not limited to the schemes in FIGS. 15-21.

An alternative to the flow of FIG. 13 is to use the same criterion in steps 1304 and 1310. However, the frequency with which read scrub is performed on the high read intensive blocks may still be reduced. For example, in some embodiments, the trigger for performing read scrub is based on a number of failed bits in a physical block. The write scheme that reduces read disturb reduces the number of failed bits (for a given number of reads) relative to the normal write scheme. Hence, by writing the high read intensive blocks with the scheme that reduces read disturb, the frequency of read scrub may be reduced even if the same criterion is used in steps 1304 and 1310.

FIG. 14 is a flowchart of one embodiment of a process 1400 of writing data to non-volatile memory. The process 1400 describes a flow for writing data associated with a logical block. The process 1400 may "pre-determine" that the logical block is a high read intensive block. The process may be performed by a combination of controller 102, control circuitry 310, read/write circuits 328 and/or decoders 324/332. Process 1400 may be performed at a time when firmware is first being loaded into the controller 102. The writes that are performed during process 1400 may include writes of system data.

Step 1406 is a determination of whether the data to be written is pre-determined to be high read intensive data. For example, there are Read Only File System (ROFS) blocks that contain system file data that are accessed by the system during boot up or other operations several times. Such files could be read an enormous number of times over the lifetime of the memory device. Some system files could potentially be read billions of times. Hence, the memory controller 102 can pre-determine that the logical blocks associated with such files will be read an enormous number of times, and as such mark these logical blocks as high read intensive blocks. Also, in some cases, the physical block need not be completely written. In some cases, only a few word lines are written. Some embodiments disclosed herein make use of this fact by selecting which word lines to write in order to reduce read disturb. This allows data scrub to be performed less frequently for such high read intensive blocks.

If the logical block is pre-determined to be high read intensive data, then step 1408 is performed. Step 1408 includes marking the logical block as a high read intensive block. In one embodiment, the controller 102 stores information that marks the block. For example, the controller 102 may already be maintaining a mapping of LBAs to PBAs. The information may be stored as a part of such mapping information.

If the logical block is pre-determined to be high read intensive data, then step 1410 is also performed. Step 1410 includes writing the physical block with a scheme that reduces read disturb.

If step 1406 is no, then the block is written with a normal write scheme, in step 1412. As noted above, FIGS. 15-21 depict various schemes for writing a block using a scheme that reduces read disturb. Step 1406 is not limited to the schemes in FIGS. 15-21.

If the logical block is not pre-determined to be high read intensive data (in step 1406), then step 1412 is also performed. Step 1412 includes writing the block using a normal write scheme. In other words, the write in step 1412 will not use a scheme that reduces read disturb. In one embodiment, the "normal" write stores user/system data on all data word lines in the physical block.

Figure 17:
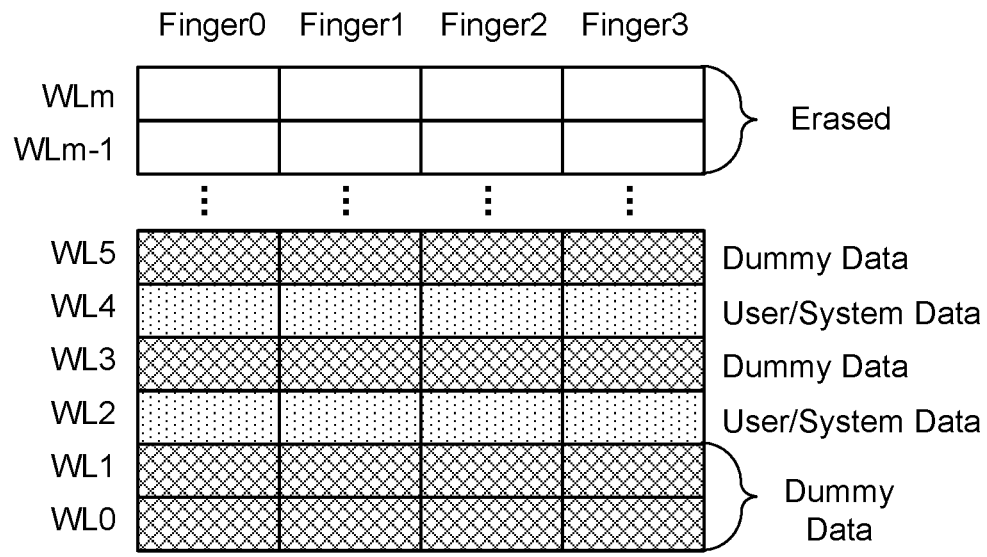
FIG. 17 depicts still another embodiment of a write scheme to reduce read disturb in an open block.
Figure 18:
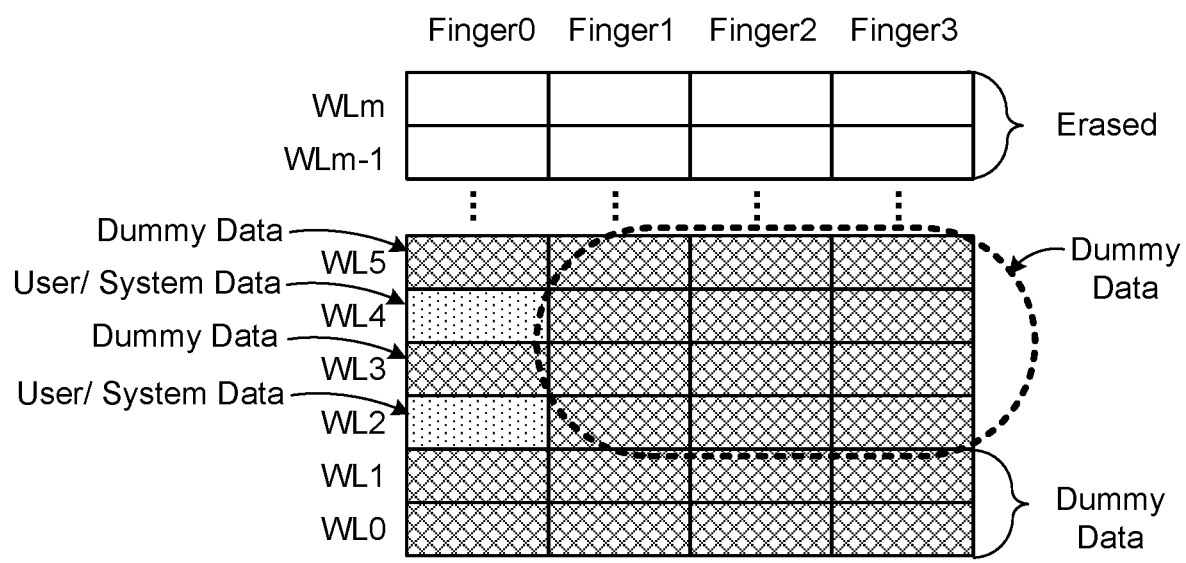
FIG. 18 depicts still another embodiment of a write scheme to reduce read disturb in an open block.
Figure 19:
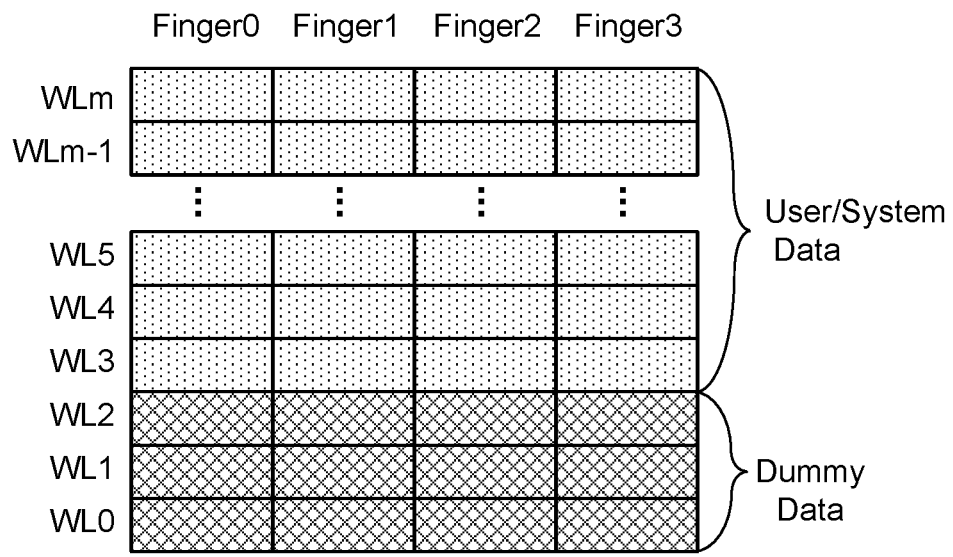
FIG. 19 depicts one embodiment of a write scheme to reduce read disturb in a closed block.
Figure 20:
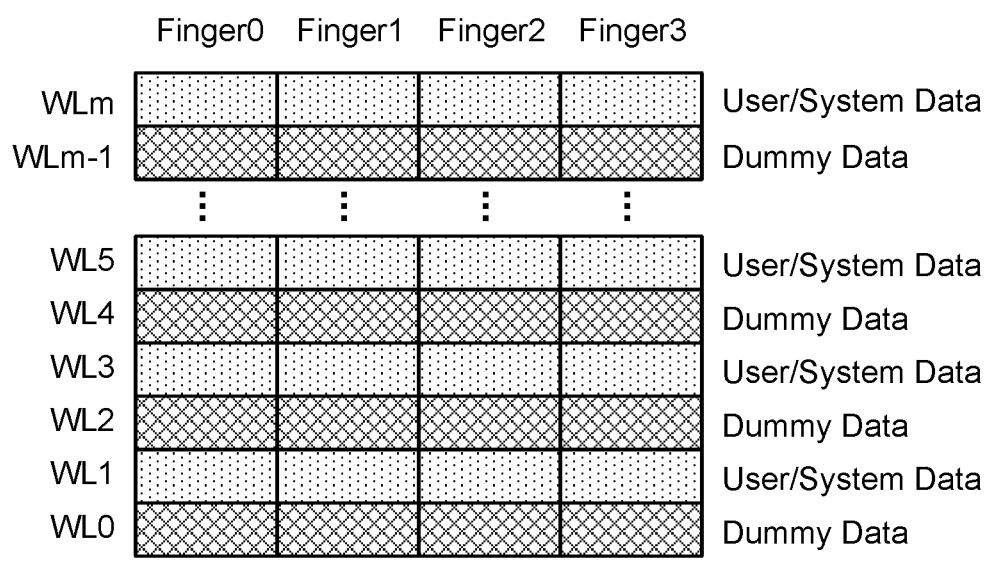
FIG. 20 depicts another embodiment of a write scheme to reduce read disturb in a closed block.
Figure 21:
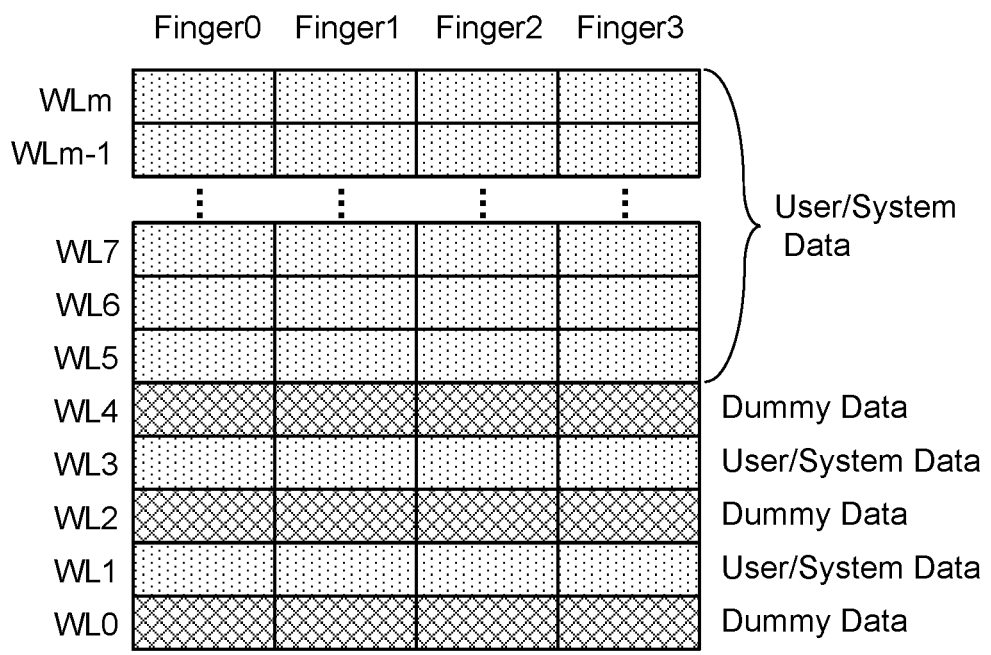
FIG. 21 depicts still another embodiment of a write scheme to reduce read disturb in a closed block.

FIGS. 15-21 depict various schemes for writing a block using a scheme that reduces read disturb. FIGS. 15-18 pertain to "open blocks." An open block is one in which some of the data word lines have all memory cells still in the erased state. In other words, an open block has at least one word line with no user/system data or dummy data written thereto. Such a word line is still eligible to have data programmed therein. FIGS. 19-21 pertain to "closed blocks." A closed block is one in which all of the data word lines have either user/system data or dummy data written thereto. Thus, a closed block does not have any word lines left that are eligible to have data programmed therein.

Figure 15:
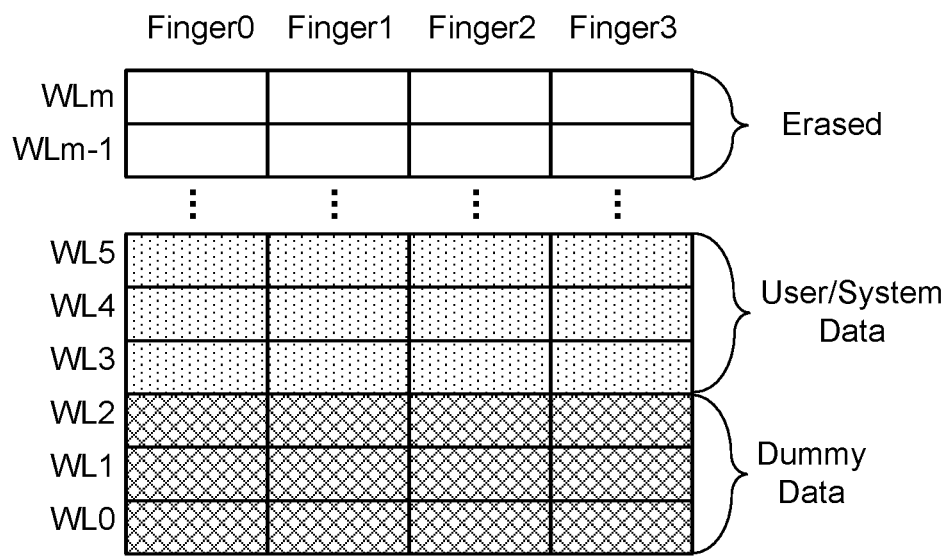
FIG. 15 depicts one embodiment of a write scheme to reduce read disturb in an open block.

FIG. 15 depicts one embodiment of a write scheme to reduce read disturb in an open block. FIG. 15 depicts one block having m+1 data word lines (WL0-WLm). Note that each of the word lines in FIG. 15 (as well as in FIGS. 16-21) are designated as data word lines. Thus, all of the word lines (WL0-WLm) are eligible to store user/system data when using a normal write scheme. Each word line has 4 fingers (Finger0, Finger1, Finger2, Finger3). The concept of a word line having fingers was discussed above in connection with FIGS. 4B and 4D.

FIG. 15 depicts a scheme in which a set of contiguous word lines are written with user/system data. However, the lowest data word lines are written with dummy data. The lowest data word lines refers to those that are at the lowest point in the column. The memory holes are the smallest at the lowest point in the column, in some embodiments. The lowest word lines (WL0-WL2) are written with dummy data. WL3-WL5 contain user/system data. FIG. 15 depicts an "open block" case in which not all word line have been written. As depicted, WLm−1 and WLm are still erased. Programming of the block proceeds from the lowest numbered word line to the highest numbered word line, in one embodiment. For example, first the lowest word lines (WL0-WL2) are written with dummy data. Next, user/system data is written from lower to higher numbered word lines. WL6-WLm−2 could either contain user/system data or be erased.

Thus, instead of storing the user/system data at lower WLs, such as WL0, WL1, etc. (which may be more prone to read disturb), user/system data can be stored at higher WLs (which may be less prone to read disturb). The lower WLs are padded with the dummy data. The suitable higher WLs to store the user/system data can be picked by doing a characterization of the memory device. This is because read disturb may depend on trim settings and the memory architecture. One possible reason for the lower WLs to be more prone to read disturb is that the lower WLs may have the smallest diameter for the memory hole.

For some architectures, word lines other than the lowest in the column may have the smallest diameter for the memory hole. Hence, the scheme of FIG. 15 (as well as those in FIGS. 16-19, and 21) may be modified to store the dummy data on other word lines that have relatively small diameter memory holes. Note that the determination of which word lines have the smallest diameter memory holes could be based on tests that measure a FBC.

Figure 16:
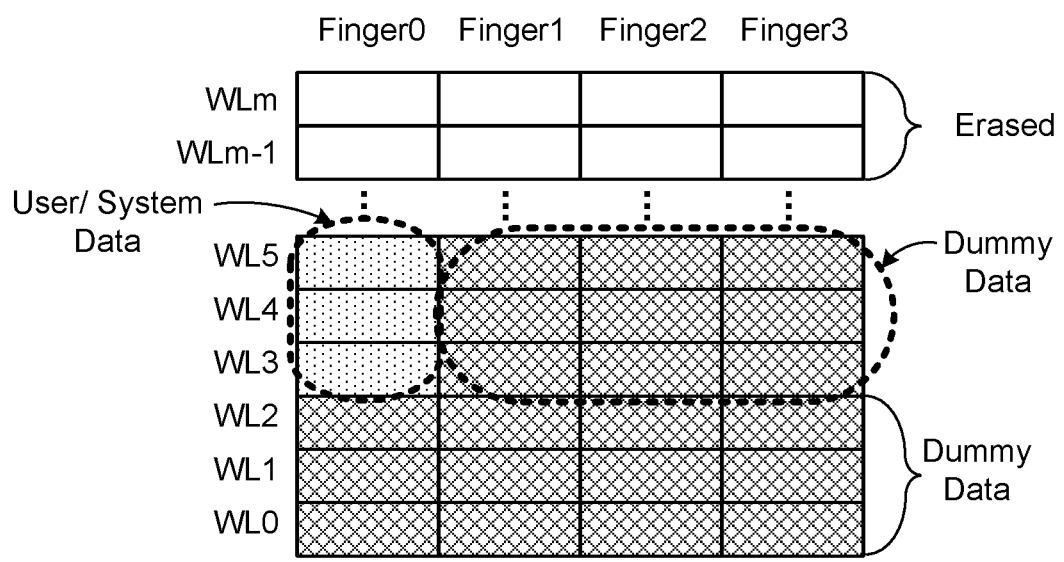
FIG. 16 depicts another embodiment of a write scheme to reduce read disturb in an open block.

In general, storing the user/system data on higher WLs (by higher it is meant higher on the column) reduces read disturb. However, read disturb may also depend on the word line fingers. If the user/system data is stored on continuous WLs only on one finger, read disturb may be improved relative to storing the user/system data on all four fingers. FIG. 16 depicts one embodiment of a write scheme to reduce read disturb in which user/system data is written to only one finger of the word lines. User/system data is written to finger 0 of WL3, WL4, WL5. User/system data could also be written to finger 0 of WL6, WL7, etc. However, user/system data is not written to finger 1, finger 2, or finger 3. Thus, when finger 0 of a word line is programmed with user/system data, dummy data is programmed on fingers 1-3 of that word line. In other embodiments, a different finger is written with user/system data. In one embodiment, when finger 1 of a word line is programmed with user/system data, dummy data is programmed on fingers 0, and 2-3 of that word line. In one embodiment, when finger 2 of a word line is programmed with user/system data, dummy data is programmed on fingers 0-1, and 3 of that word line. In one embodiment, when finger 3 of a word line is programmed with user/system data, dummy data is programmed on fingers 0-2 of that word line. In some embodiments, user/system data can be stored on any combination of fingers of a word line, with dummy data on the remaining fingers of the word line. In some embodiments, user/system data is stored on any combination of two fingers of a word line, with dummy data on the remaining two fingers of the word line. In some embodiments, user/system data is stored on any combination of three fingers of a word line, with dummy data on the remaining finger of the word line. There may be more or fewer than four fingers on a word line. Thus, the concept of storing user/system data on one or more fingers of a word line and dummy data on the remaining fingers of the word line may be extended to word lines having more or fewer than four fingers.

In one embodiment, dummy data is stored in word lines that neighbor word lines that contain user/system data in order to reduce read disturb. FIG. 17 depicts one embodiment of a write scheme to reduce read disturb in an open block. User/system data is stored in WL2 and WL4. Dummy data is stored in WL1, WL3, and WL5. Thus, dummy data is stored in word lines that neighbor word lines that contain user/system data. Thus, dummy data is stored in data word lines on each side of the data word lines in which the user/system data is stored. In this example only one word line contains dummy data between two word lines that contain user/system data. However, there could be two or more word lines containing dummy data between two word lines that contain user/system data. In this example, the lowest word line to which user/system data is written is WL2, but another word line could be used. FIG. 17 is another example of an open block, in which some word lines (e.g., WLm−1, WLm) are still erased. The pattern of alternating between storing user/system data and dummy data may be continued upwards at word lines WL6, WL7, etc.

FIG. 18 is a variation of the embodiment of FIG. 17 in which the user/system data is confined to finger 0. Dummy data is stored on WL0 and WL1. User/system data is stored on finger 0 of WL2, WL4. User/system data could also be stored to finger 0 of WL6, WL8, etc. However, user/system data is not written to finger 1, finger 2, or finger 3. Thus, when finger 0 of a word line is programmed with user/system data, dummy data is programmed on fingers 1-3 of that word line. In other embodiments, a different finger is written with user/system data. In one embodiment, when finger 1 of a word line is programmed with user/system data, dummy data is programmed on fingers 0, and 2-3 of that word line. In one embodiment, when finger 2 of a word line is programmed with user/system data, dummy data is programmed on fingers 0-1, and 3 of that word line. In one embodiment, when finger 3 of a word line is programmed with user/system data, dummy data is programmed on fingers 0-2 of that word line. In some embodiments, user/system data can be stored on any combination of fingers of a word line, with dummy data on the remaining fingers of the word line. In some embodiments, user/system data is stored on any combination of two fingers of a word line, with dummy data on the remaining two fingers of the word line. In some embodiments, user/system data is stored on any combination of three fingers of a word line, with dummy data on the remaining finger of the word line. There may be more or fewer than four fingers on a word line. Thus, the concept of storing user/system data on one or more fingers of a word line and dummy data on the remaining fingers of the word line may be extended to word lines having more or fewer than four fingers. This is an open block example as indicated by WLm−1 and WLm being erased. The pattern of alternating between storing user/system data and dummy data may be continued upwards at word lines (e.g., WL6 stores user/system, WL7 stores dummy, WL8 stores user/system, WL9 stores dummy). Note that having the two lowest word lines storing dummy data in FIGS. 18-19 is just one example.

Note that one example use case for the schemes of FIGS. 15-18 are when the memory system will only be writing to a few word lines in the block. One example is are Read Only File System (ROFS) blocks. However, FIGS. 15-18 are not limited to when the memory system will only be writing to a few word lines in the block.

Write schemes to reduce read disturb may also be applied to closed blocks. FIGS. 19-21 depict embodiments in which write schemes to reduce read disturb may also be applied to closed blocks. FIG. 19 depicts an embodiment that is similar to the embodiment of FIG. 15, but is for a closed block. Dummy data is stored in WL0-WL2. User/system data is stored in WL3-WLm. A variation of the embodiment of FIG. 19 is to confine the user/system data to one or more fingers of a word line with dummy data on the remaining fingers of the word line. For example, the user/system data could be confined to finger 0, with fingers 1, 2, and 3 all storing dummy data.

FIG. 20 depicts an embodiment that is similar to the embodiment of FIG. 17, but is for a closed block. Dummy data is stored on the even numbered word lines, and user/system data is stored on the odd word lines. In this embodiment, half of the capacity of the block is lost. However, read disturb may be reduced considerably. Hence, the number of read scrub operations may be reduced. It is not required to use the odd word lines for the user/system data. Thus, the even numbered word lines are used for user/system data and the odd word lines for dummy data, in one embodiment.

FIG. 21 depicts an embodiment in which dummy data is stored on WL0, WL2, and WL4. User/system data is stored on the remaining word lines. Storing the dummy data on some of the lower word lines can reduce read disturb for memory cells having the smallest memory holes. For memory cells having larger memory holes, it may not be needed to have dummy data stored on neighboring word lines. Hence, the capacity of the block is increased substantially over an embodiment of FIG. 20, while still reducing read disturb for memory cells that are most susceptible to read disturb.

Figure 22:
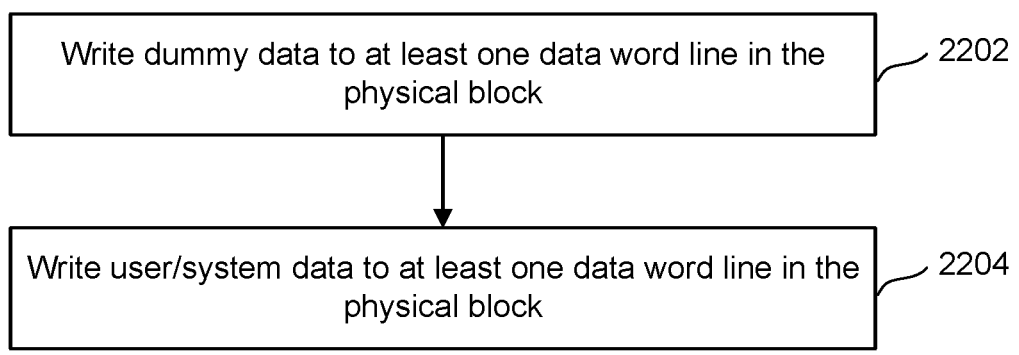
FIG. 22 is a flowchart of one embodiment of a process of write scheme for reducing read disturb.

FIG. 22 is a flowchart of one embodiment of a process of write scheme for reducing read disturb. The process may be used in steps 1308, 1404 and/or 1410. Step 2202 includes writing dummy data to at least one data word line in the physical block. In one embodiment, writing the dummy data includes programming the memory cells on at the least one data word line to have a minimum threshold voltage. For example, all of the memory cells could be program verified at Vv4 (see FIG. 5). It is not required that every memory cell on a data word line be programmed with dummy data. On other words, some of the memory cells may remain in the erased state.

Step 2204 includes writing user/system data to at least one data word line in the physical block. Writing user/system data could result in a distribution such as in FIG. 5, for a three bit per memory cell embodiment. More or fewer than three bits may be stored per memory cell. In one embodiment, user/system data is written to all fingers of a data word line. In one embodiment, user/system data is written to only one finger of a data word line with dummy data written to remaining fingers of the word line. In one embodiment, user/system data is written to one or more fingers of a data word line, with dummy data written to remaining fingers of the word line.

Figure 23:
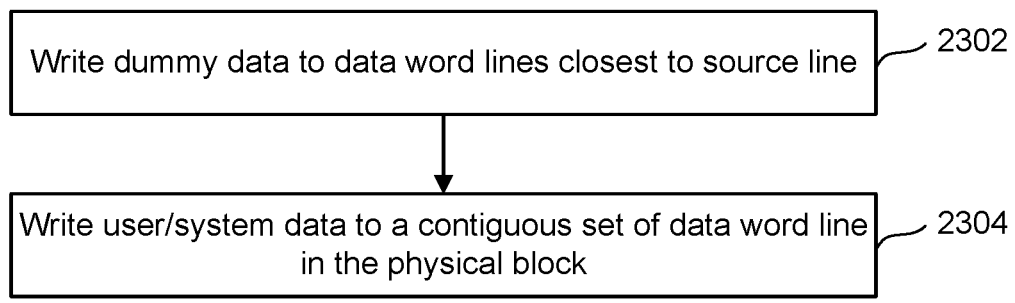
FIG. 23 is a flowchart of another embodiment of a process of write scheme for reducing read disturb that includes writing dummy data to data word lines closest to the source line.

FIG. 23 is a flowchart of another embodiment of a process of write scheme for reducing read disturb. The process may be used to program patterns such as in FIGS. 15 and 19. The process may be used in steps 1308, 1404 and/or 1410. Step 2302 includes writing dummy data to data word lines closest to the source line. The dummy data may be programmed as described in step 2202. Step 2304 includes writing user/system data to a contiguous set of data word line in the physical block. The user/system data may be programmed as described in step 2204.

Figure 24:
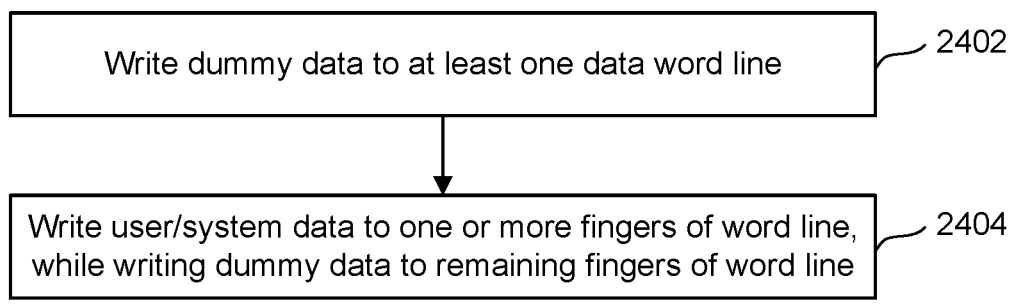
FIG. 24 is a flowchart of another embodiment of a process of write scheme for reducing read disturb that includes to writing user/system data to one or more fingers of a data word line, while storing dummy data to at least one finger of the data word line.

FIG. 24 is a flowchart of another embodiment of a process of write scheme for reducing read disturb. The process may be used to program patterns such as in FIGS. 16 and 18. The process may be used in steps 1308, 1404 and/or 1410. Step 2402 includes writing dummy data to at least one data word line in the block. In one embodiment, dummy data is written to the data word line closest to the source line. In some embodiments, dummy data is written to more than one data word line closest to the source line. The dummy data may be programmed as described in step 2202. Step 2404 includes writing user/system data to one or more fingers of a data word line in the physical block while writing dummy data to remaining one or more fingers of the data word line. In one embodiment, user/system data is written to one finger while dummy data is written to the remaining (e.g., three) fingers. In one embodiment, user/system data is written to two fingers while dummy data is written to the remaining (e.g., two) fingers. In one embodiment, user/system data is written to three fingers while dummy data is written to the remaining (e.g., one) fingers. The user/system data may be programmed as described in step 2204.

Figure 25:
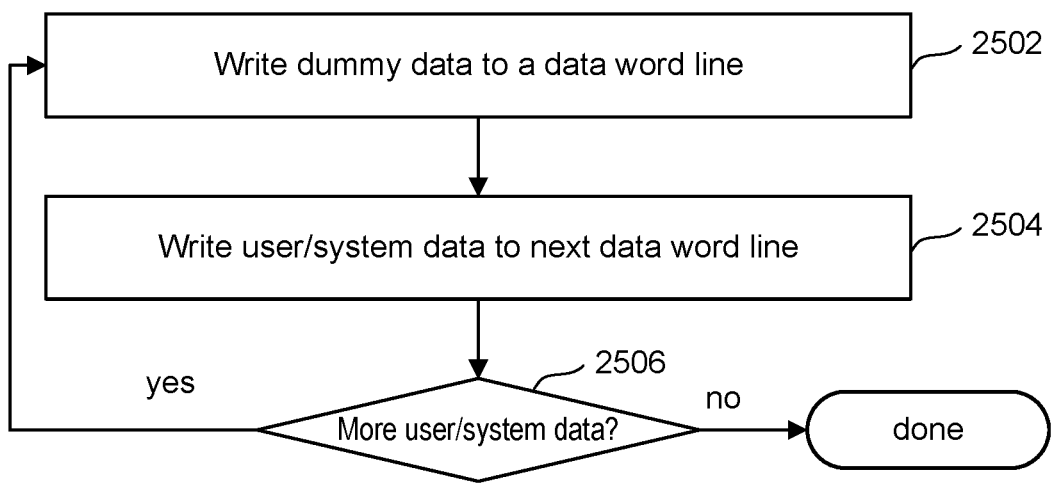
FIG. 25 is a flowchart of another embodiment of a process of write scheme for reducing read disturb that includes writing dummy data and user/system data on alternating data word lines.

FIG. 25 is a flowchart of another embodiment of a process of write scheme for reducing read disturb. The process stores dummy data and user/system data on alternating data word lines in the physical block. The process may be used to program a pattern such as in FIG. 20. The process may be used in steps 1308, 1404 and/or 1410. Step 2502 includes writing dummy data to a data word line in the block. In one embodiment, dummy data is written to the data word line closest to the source line the first time step 2502 is performed. The dummy data may be programmed as described in step 2202. Step 2504 includes writing user/system data the next data word line in the physical block. The user/system data may be programmed as described in step 2204. Step 2506 is a determination of whether there is more user/system data to program. If so, the process returns to step 2502. Thus, the process may be used to fill the block (closed block), or leave the block open.

Numerous variations of the process of FIG. 25 are possible. For example, the first time step 2502 is performed, multiple data word lines may be programmed with dummy data (see FIG. 17). Another variation is to skip step 2502 after a few iterations (see FIG. 21).

Numerous variations of the processes of FIGS. 22-25 are possible. For example, in FIG. 23, the dummy data is programmed to the data word lines closest to the source line, in step 2302. Step 2302 may be modified by programming dummy data to the word line with the smallest memory holes (noting the word line with the smallest memory holes are not necessarily closest to the source line).

Although some of the examples pertain to write schemes when the block has a single tier, write schemes to reduce read disturb may be applied to blocks that have two or more tiers. For example, the patterns depicted in FIGS. 15-21 could be applied to each of two or more tiers in the block.

Figure 26:
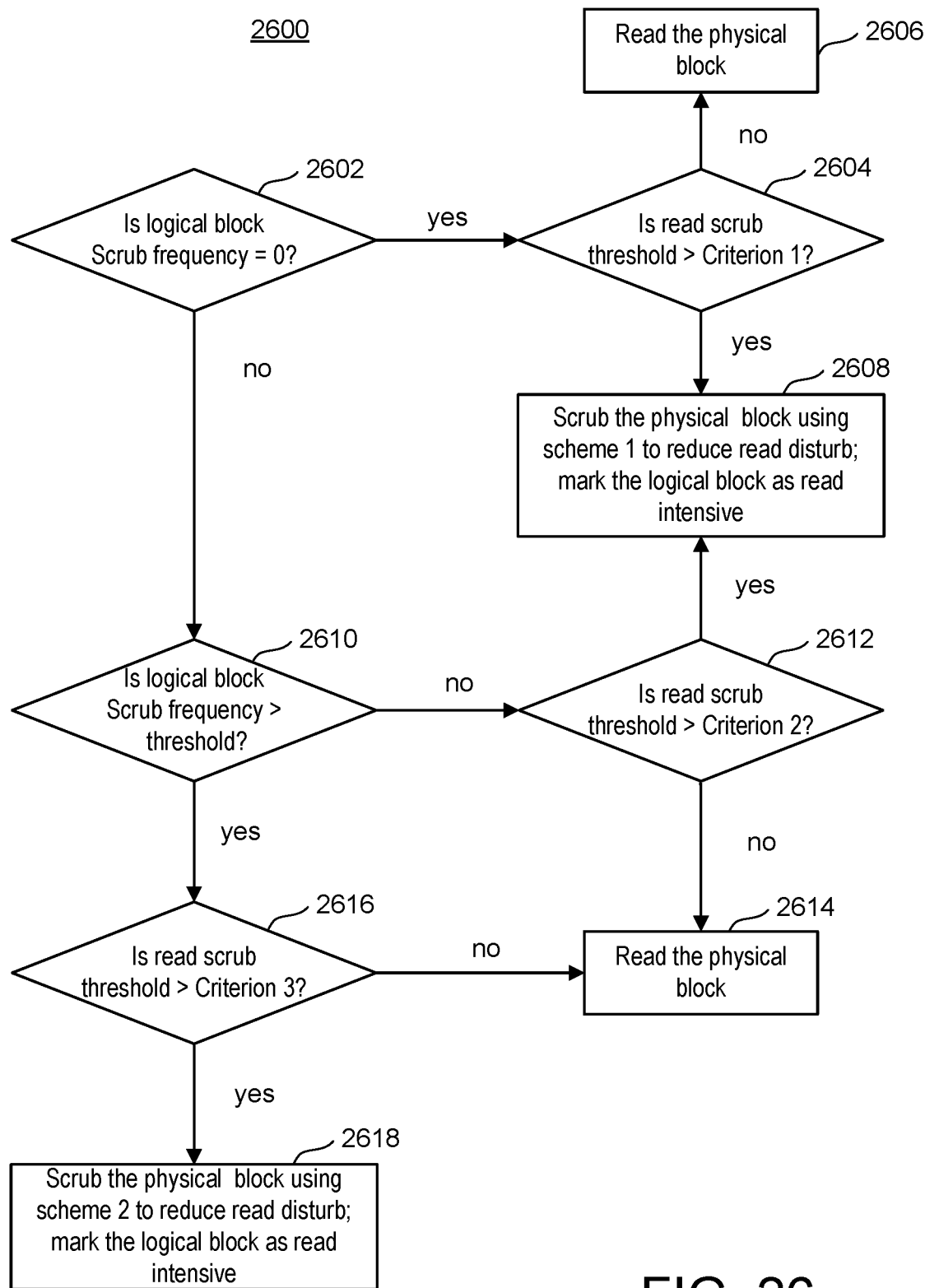
FIG. 26 is a flowchart of one embodiment of a process of reading data from non-volatile memory, and dynamically marking a block as a high read intensive block.

FIG. 26 is a flowchart of one embodiment of a process 2600 of reading data from non-volatile memory. The process 2600 may dynamically determine whether a logical block is a normal, medium or high read intensive block. The process use a write scheme during a scrub process, wherein the write scheme reduces read disturb. Moreover, a write scheme used for the high read intensive blocks is more effective at reducing read disturb then the write scheme for the normal and medium read intensive blocks, in an embodiment. The process may be performed by a combination of controller 102, control circuitry 310, read/write circuits 328 and/or decoders 324/332. Process 2600 is performed in response to a determination that a physical block is to be read. For example, the memory controller 102 may receive a request from the host to read data at an LBA. The controller 102 determines a PBA from the LBA, in some embodiments. Thus, the physical block is mapped to a logical block.

One aspect to note about process 2600 is that a different criterion is used to determine whether to scrub the physical block, depending on the scrub frequency of the logical block. Three criterion are used in process 2600. These are referred to as Criterion 1, Criterion 2, and Criterion 3 for ease of discussion. These Criterion may be different from the criterion in process 1300. The criterion is the most relaxed for the high read intensive blocks. In one embodiment, Criterion 3 is more relaxed than Criterion 2, which is more relaxed than Criterion 1. The more relaxed criterion reduces the number of times that the physical blocks that correspond to a high read intensive logical block are scrubbed. However, the physical blocks that correspond to a high read intensive block are written with a scheme that reduces read disturb. This scheme allows the physical blocks that correspond to a high read intensive block to be scrubbed less often, while still being able to decode data stored in those physical blocks.

Step 2602 includes the controller 102 determining whether the logical block scrub frequency is zero. If the frequency is zero, then step 2604 is performed. Note this path is for a normal read intensive block. Step 2604 is a determination of whether a read scrub threshold is greater than a Criterion 1. If not, then the physical block is read in step 2606. If the read scrub threshold is greater than Criterion 1, the step 2608 is performed. Step 2608 includes scrubbing the block, using a first write scheme (scheme 1) that reduces read disturb. Scrubbing the block may be performed in accordance with process 1100, noting the write in step 1306 will use a scheme that reduces read disturb. FIGS. 15-21 show various embodiments of write schemes that reduce read disturb. Step 2608 also includes marking the logical block as a read intensive block.

Next, a flow starting at step 2602 in which the logical block scrub frequency is not zero will be described. Step 2610 includes determining whether the logical block scrub frequency is greater than a threshold. This threshold is used to delineate between what is referred to herein as a medium read intensive block and a high read intensive block, in one embodiment. If the logical block scrub frequency is not greater than the threshold, then step 2612 is performed. This is the path for the medium read intensive block. Step 2612 is a determination of whether a read scrub threshold is greater than a Criterion 2. Criterion 2 is more relaxed than Criterion 1, in an embodiment. For example, Criterion 2 could require a higher read count than Criterion 1. As another example, Criterion 2 could require a higher FBC than Criterion 1. If the read scrub threshold is greater than Criterion 2, then step 2608 is performed. Otherwise, the physical block is read in step 2614.

Next, a flow starting at step 2610 in which the logical block scrub frequency is greater than the threshold will be described. This is the flow for a high read intensive block. Step 2616 is a determination of whether a read scrub threshold is greater than a Criterion 3. Criterion 3 is more relaxed than Criterion 2 (and Criterion 2 is more relaxed than Criterion 1), in an embodiment. For example, Criterion 3 could require a higher read count than Criterion 2, and Criterion 2 could require a higher read count than Criterion 1. As another example, Criterion 3 could require a higher FBC than Criterion 2, and Criterion 2 could require a higher FBC than Criterion 2. If the read scrub threshold is greater than Criterion 3, then step 2618 is performed. Otherwise, the physical block is read in step 2614. Step 2618 includes scrubbing the block, using a second write scheme (scheme 2) that reduces read disturb. The second write scheme is more effective at reducing read disturb than the first write scheme, in one embodiment. Scrubbing the block may be performed in accordance with process 1100, noting the write in step 1306 will use a scheme that reduces read disturb. FIGS. 15-21 show various embodiments of write schemes that reduce read disturb. Step 2608 also includes marking the logical block as a read intensive block.

A first embodiment includes an apparatus comprising non-volatile memory cells arranged in physical blocks, and one or more control circuits in communication with the non-volatile memory cells. The one or more control circuits are configured to write data to a physical block of the non-volatile memory cells with a scheme to reduce read disturb if a logical block associated with the physical block has a read intensity greater than a threshold.

In a second embodiment, and in furtherance of the first embodiment, the one or more control circuits are further configured to use a read scrub criterion for the physical block based on the read intensity of the logical block.

In a third embodiment, and in furtherance of the first or second embodiment, the one or more control circuits configured to write data with the scheme to reduce read disturb comprises the one or more control circuits configured to store dummy data in data memory cells in the physical block.

In a fourth embodiment, and in furtherance of any of the first to third embodiments, the one or more control circuits are further configured to write data to the physical block of the non-volatile memory cells using a scheme that stores user/system data on all data memory cells in the physical block if the logical block has a read intensity less than the threshold.

In a fifth embodiment, and in furtherance of any of the first to fourth embodiments, the non-volatile memory cells are arranged in columns in the physical block, and the columns have a diameter that varies based on location of the non-volatile memory cells along the column. The one or more control circuits configured to write data with the scheme to reduce read disturb comprises the one or more control circuits configured to store dummy data in data memory cells at which the columns have the smallest diameter.

In a sixth embodiment, and in furtherance of any of the first to fifth embodiments, the physical block comprises data word lines and a source line; and the one or more control circuits configured to write data with the scheme to reduce read disturb comprises the one or more control circuits configured to store dummy data in data word lines closest to the source line.

In a seventh embodiment, and in furtherance of any of the first to sixth embodiments, the physical block comprises data word lines. The one or more control circuits configured to write data with the scheme to reduce read disturb comprises the one or more control circuits configured to store user/system data in one or more of the data word lines; and store dummy data in data word lines on each side of the one or more data word lines in which the user/system data is stored.

In an eighth embodiment, and in furtherance of any of the first to seventh embodiments, the one or more control circuits configured to write data with the scheme to reduce read disturb comprises the one or more control circuits configured to store dummy data and user/system data on alternating data word lines in the physical block.

In a ninth embodiment, and in furtherance of any of the first to eighth embodiments, the one or more control circuits configured to write data with the scheme to reduce read disturb comprises the one or more control circuits configured to store dummy data on at least one finger of a data word line in the physical block.

An embodiment includes a method comprising performing a read scrub of a first physical block for which an associated first logical block has a read intensity above a threshold responsive to a first criterion to scrub being met with respect to the first physical block, including writing the first physical block using a scheme that improves read disturb. The method further includes reading the first physical block without performing a read scrub responsive to the first criterion to scrub not being met. The method further includes performing a read scrub of a second physical block for which an associated second logical block has a read intensity below the threshold responsive to a second criterion to scrub being met with respect to the second physical block. The method further includes reading the second physical block without performing a read scrub responsive to the second criterion to scrub not being met.

An embodiment includes a non-volatile storage device comprising a three-dimensional array comprising physical blocks of non-volatile memory cells, the physical blocks comprising data word lines; and one or more control circuits in communication with the data word lines and the non-volatile memory cells. The one or more control circuits are configured to store dummy data in first data word lines in a first physical block and store user/system data in second data word lines in the first physical block responsive to a read intensity of a first logical block associated with the first physical block being greater than a threshold. The one or more control circuits are further configured to store user/system data in all data word lines in a second physical block responsive to a read intensity of a second logical block associated with the second physical block being less than the threshold.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   non-volatile memory cells arranged in physical blocks, wherein the physical blocks comprise data word lines connected to the memory cells, wherein each data word line is divided into a plurality of regions; and
   one or more control circuits in communication with the non-volatile memory cells, the one or more control circuits configured to:
     write data to a physical block of the non-volatile memory cells with a scheme to reduce read disturb if a logical block associated with the physical block has a read intensity greater than a threshold, including store dummy data in at least one region of the regions of a data word line in the physical block and store user data in at least one other region of the regions of the data word line in the physical block.

2. The apparatus of claim 1, wherein the one or more control circuits are further configured to:
   use a read scrub criterion for the physical block based on the read intensity of the logical block.

3. The apparatus of claim 1, wherein the physical block is a first physical block, the logical block is a first logical block, and the one or more control circuits are further configured to:
   write data to a second physical block of the non-volatile memory cells using a scheme that stores user/system data on all data memory cells in the second physical block if a second logical block associated with the second physical block has a read intensity less than the threshold.

4. The apparatus of claim 1, wherein:
   the non-volatile memory cells are arranged in columns in the physical block, the columns have a diameter that varies based on location of the non-volatile memory cells along the column; and
   the one or more control circuits configured to write data with the scheme to reduce read disturb comprises the one or more control circuits configured to store dummy data in data memory cells at which the columns have the smallest diameter.

5. The apparatus of claim 1, wherein:
   the physical block comprises data word lines and a source line; and
   the one or more control circuits configured to write data with the scheme to reduce read disturb comprises the one or more control circuits configured to store dummy data in data word lines closest to the source line.

6. The apparatus of claim 1, wherein the one or more control circuits are further configured to:
   store dummy data in data word lines on each side of the data word line in which the dummy data is stored in the at least one region of the regions and the user data is stored in at the least one of region the other regions.

7. The apparatus of claim 1, wherein the one or more control circuits are further configured to:
   store dummy data and user/system data on alternating data word lines in a second physical block if a second logical block associated with the second physical block has a read intensity less than the threshold.

8. The apparatus of claim 1, wherein each region of the plurality of regions of each data word lines comprises a finger.

9. A method comprising:
   performing a read scrub of a first physical block for which an associated first logical block has a read intensity above a threshold responsive to a first criterion to scrub being met with respect to the first physical block, wherein the first physical block comprises word lines, wherein each word line is divided into a plurality of fingers, performing the read scrub including writing the first physical block using a scheme that improves read disturb, writing the first physical block using a scheme that improves read disturb includes storing dummy data in at least one finger of the fingers of a data word line in the first physical block and storing user data on the other fingers of the data word line in the first physical block;

reading the first physical block without performing a read scrub responsive to the first criterion to scrub not being met;

performing a read scrub of a second physical block for which an associated second logical block has a read intensity below the threshold responsive to a second criterion to scrub being met with respect to the second physical block; and reading the second physical block without performing a read scrub responsive to the second criterion to scrub not being met.

10. The method of claim 9, wherein the first criterion is more relaxed than the second criterion.

11. The method of claim 9, further comprising:

marking the second logical block as a high read intensive block responsive to a read intensity associated with the second logical block being greater than the threshold.

12. The method of claim 9, wherein performing the read scrub of the second physical block further comprises writing the second physical block using a scheme that reduces read disturb responsive to a read intensity associated with the second logical block being greater than a threshold.

13. A non-volatile storage device comprising:

a three-dimensional array comprising physical blocks of non-volatile memory cells, the physical blocks comprising data word lines, wherein the non-volatile memory cells are arranged in columns in the physical blocks, the columns having a diameter that varies depending on location of the non-volatile memory cells along the columns; and one or more control circuits in communication with the data word lines and the non-volatile memory cells, the one or more control circuits configured to:

store dummy data in first data word lines in a first physical block and store user/system data in second data word lines in the first physical block responsive to a read intensity of a first logical block associated with the first physical block being greater than a threshold, the first data word lines in the first physical block comprising a set of data word lines at which the columns have the smallest diameter; and store user/system data in all data word lines in a second physical block responsive to a read intensity of a second logical block associated with the second physical block being less than the threshold.

14. The non-volatile storage device of claim 13, wherein the one or more control circuits are further configured to:

perform a read scrub of the first physical block responsive to a first criterion to scrub being met with respect to the first physical block, including write the first physical block with a scheme that reduces read disturb; and perform a read scrub of the second physical block responsive to a second criterion to scrub being met with respect to the second physical block, the second criterion is more strict than the first criterion.

15. The non-volatile storage device of claim 13, wherein the first data word lines in the first physical block comprise a contiguous set of data word lines closest to a source line.

16. The non-volatile storage device of claim 13, wherein each of the second data word lines in the first physical block has at least one of the first data word lines on each side each respective second data word line.

17. An apparatus, comprising:

non-volatile memory cells arranged in physical blocks, the non-volatile memory cells arranged in columns in the physical block, the columns having a diameter that varies based on location of the non-volatile memory cells along the column, the non-volatile memory cells including data memory cells; and one or more control circuits in communication with the non-volatile memory cells, the one or more control circuits configured to:

write data to a physical block of the non-volatile memory cells with a scheme to reduce read disturb if a logical block associated with the physical block has a read intensity greater than a threshold, the one or more control circuits configured to write data with the scheme to reduce read disturb by storing dummy data in data memory cells at which the columns have the smallest diameter.

18. The apparatus of claim 17, wherein the non-volatile memory cells are arranged in NAND strings in the physical block.

* * * * *